(12) United States Patent
French et al.

(10) Patent No.: US 8,995,691 B2
(45) Date of Patent: Mar. 31, 2015

(54) AUDIO AMPLIFIER

(75) Inventors: John B. French, Caledon East (CA); Andrew Mason, Bolton (CA)

(73) Assignee: Audera Acoustics Inc., Schomberg (CA)

( * ) Notice: Subject to any disclaimer, the term of this patent is extended or adjusted under 35 U.S.C. 154(b) by 1254 days.

(21) Appl. No.: 12/501,816

(22) Filed: Jul. 13, 2009

(65) Prior Publication Data

US 2010/0014694 A1   Jan. 21, 2010

Related U.S. Application Data

(60) Provisional application No. 61/080,418, filed on Jul. 14, 2008.

(51) Int. Cl.
| | |
|---|---|
| H03F 99/00 | (2009.01) |
| H03F 1/02 | (2006.01) |
| H03F 3/217 | (2006.01) |
| H03F 3/68 | (2006.01) |

(52) U.S. Cl.
CPC ............ *H03F 1/0227* (2013.01); *H03F 3/2173* (2013.01); *H03F 3/68* (2013.01); *H03F 2200/03* (2013.01)
USPC ........................................................ 381/120

(58) Field of Classification Search
CPC ....................................................... H03F 1/025
USPC ........................................................ 381/120
See application file for complete search history.

(56) References Cited

U.S. PATENT DOCUMENTS

| | | | |
|---|---|---|---|
| 3,784,923 A | 1/1974 | Rezek | |
| 3,900,823 A | 8/1975 | Sokal et al. | |
| 4,092,610 A | 5/1978 | White et al. | |
| 4,393,395 A | 7/1983 | Hacke et al. | |
| 4,409,535 A | 10/1983 | Hickman | |
| 4,430,625 A | 2/1984 | Yokoyama | |
| 4,484,145 A | 11/1984 | Haulin | |
| 4,926,140 A | 5/1990 | Schenberg | |
| 4,938,223 A | 7/1990 | Charters et al. | |
| 5,075,634 A | 12/1991 | French | |
| 5,287,288 A | 2/1994 | Brennen et al. | |
| 5,345,377 A | 9/1994 | Edwards | |
| 5,351,178 A | 9/1994 | Brennen et al. | |

(Continued)

FOREIGN PATENT DOCUMENTS

| | | |
|---|---|---|
| AU | 683308 | 11/1997 |
| EP | 732004 | 4/1998 |

(Continued)

OTHER PUBLICATIONS

Smedegaard, Michael, "A Simple Non-Feedback Switching Power Output Stage", Becker Automotive Systems GmbH, System Development (SD), Im Stockmadle, 1 D-76307 Karlsbad, Germany.

(Continued)

*Primary Examiner* — Duc Nguyen
*Assistant Examiner* — Kile Blair
(74) *Attorney, Agent, or Firm* — Bereskin & Parr LLP/S.E.N.C.R.L., s.r.l.

(57) ABSTRACT

The embodiments described herein relate to amplifier circuits with power rails. The power rails are generated in response to an input signal, which will typically be an audio signal, and with a sufficient magnitude to power the amplifier and to generate an output signal corresponding to the input signal.

20 Claims, 17 Drawing Sheets

(56) References Cited

U.S. PATENT DOCUMENTS

| | | | |
|---|---|---|---|
| 5,351,180 A | 9/1994 | Brennen et al. |
| 5,351,181 A | 9/1994 | Brennen et al. |
| 5,355,025 A | 10/1994 | Moran et al. |
| 5,359,275 A | 10/1994 | Edwards |
| 5,382,915 A | 1/1995 | Muri et al. |
| 5,384,696 A | 1/1995 | Moran et al. |
| 5,396,194 A | 3/1995 | Williamson et al. |
| 5,424,684 A | 6/1995 | Nishioka et al. |
| 5,442,317 A | 8/1995 | Stengel |
| 5,469,509 A | 11/1995 | Navone et al. |
| 5,479,134 A | 12/1995 | Nishioka et al. |
| 5,506,493 A | 4/1996 | Stengel |
| 5,508,658 A | 4/1996 | Nishioka et al. |
| 5,510,753 A | 4/1996 | French |
| 5,543,753 A | 8/1996 | Williamson |
| 5,563,781 A | 10/1996 | Clauter et al. |
| 5,606,289 A | 2/1997 | Williamson |
| 5,898,340 A | 4/1999 | Chatterjee et al. |
| 5,929,702 A | 7/1999 | Myers et al. |
| 5,937,074 A | 8/1999 | Carver |
| 5,982,231 A | 11/1999 | Nalbant |
| 5,990,751 A | 11/1999 | Takita |
| 6,011,434 A | 1/2000 | Sakai |
| 6,091,222 A | 7/2000 | Vertemara et al. |
| 6,130,954 A | 10/2000 | Carver |
| 6,148,220 A | 11/2000 | Sharp et al. |
| 6,175,272 B1 | 1/2001 | Takita |
| 6,211,728 B1 | 4/2001 | Chen et al. |
| 6,256,482 B1 | 7/2001 | Raab |
| 6,262,632 B1 | 7/2001 | Corsi et al. |
| 6,263,084 B1 | 7/2001 | Cressman et al. |
| 6,313,697 B1 | 11/2001 | Neuteboom et al. |
| 6,373,340 B1 | 4/2002 | Shashoua |
| 6,388,514 B1 | 5/2002 | King et al. |
| 6,418,231 B1 | 7/2002 | Carver |
| 6,470,084 B1 | 10/2002 | Van Zanten |
| 6,492,868 B2 | 12/2002 | Kirn |
| 6,496,059 B1 | 12/2002 | Nguyen |
| 6,590,447 B1 | 7/2003 | Willis |
| 6,611,169 B2 | 8/2003 | Mendenhall |
| 6,636,112 B1 | 10/2003 | McCune |
| 6,725,109 B2 | 4/2004 | Hile et al. |
| 6,734,724 B1 | 5/2004 | Schell et al. |
| 6,781,453 B2 | 8/2004 | Kirn |
| 6,788,140 B2 | 9/2004 | Cameron et al. |
| 6,816,016 B2 | 11/2004 | Sander et al. |
| 6,825,726 B2 | 11/2004 | French et al. |
| 6,853,242 B2 | 2/2005 | Melanson et al. |
| 6,894,559 B1 | 5/2005 | Dolman |
| 6,922,101 B2 | 7/2005 | Bayko |
| 6,937,094 B2 | 8/2005 | Khanifar et al. |
| 6,947,548 B2 | 9/2005 | Ferianz |
| 6,963,189 B2 | 11/2005 | Nielsen et al. |
| 6,967,527 B2 | 11/2005 | Fukushima |
| 6,998,911 B2 | 2/2006 | Honda et al. |
| 7,023,269 B2 | 4/2006 | Meng et al. |
| 7,034,614 B2 | 4/2006 | Robinson et al. |
| 7,042,282 B2 | 5/2006 | Schell et al. |
| 7,057,381 B2 | 6/2006 | Harriman et al. |
| 7,110,739 B2 | 9/2006 | Braithwaite |
| 7,119,499 B2 | 10/2006 | Ishigaki et al. |
| 7,167,048 B2 | 1/2007 | Mendenhall |
| 7,170,339 B2 | 1/2007 | Saito et al. |
| 7,170,340 B1 | 1/2007 | Bhatt et al. |
| 7,184,288 B2 | 2/2007 | Galbiati |
| 7,253,683 B2 | 8/2007 | Mendenhall |
| 7,253,684 B2 | 8/2007 | Mendenhall |
| 7,298,214 B2 | 11/2007 | Lee et al. |
| 7,307,474 B2 | 12/2007 | Nguyen |
| 7,315,190 B1 | 1/2008 | Chen et al. |
| 7,321,262 B2 | 1/2008 | Nielsen et al. |
| 7,342,328 B1 | 3/2008 | Eddleman |
| 7,362,168 B2 * | 4/2008 | French et al. ................ 330/10 |
| 7,378,903 B2 | 5/2008 | Bates |
| 7,456,686 B2 | 11/2008 | Nadd |
| 7,468,631 B1 | 12/2008 | Sutardja |
| 7,468,632 B2 | 12/2008 | Zepp |
| 7,474,157 B2 | 1/2009 | Lo et al. |
| 7,498,876 B2 | 3/2009 | Peruzzi et al. |
| 7,501,889 B2 | 3/2009 | Mendenhall |
| 7,518,444 B2 | 4/2009 | Andersen et al. |
| 7,583,137 B2 | 9/2009 | Pedersen et al. |
| 7,592,934 B1 | 9/2009 | Bourstein et al. |
| 7,619,480 B2 | 11/2009 | North |
| 7,675,361 B2 | 3/2010 | Guo et al. |
| 7,692,488 B2 | 4/2010 | Wong et al. |
| 7,702,120 B1 | 4/2010 | Ferstenberg |
| 7,714,660 B2 * | 5/2010 | Lesso et al. ................ 330/297 |
| 7,737,776 B1 | 6/2010 | Cyrusian |
| 7,755,431 B2 | 7/2010 | Sun |
| 7,782,129 B2 | 8/2010 | Mallinson et al. |
| 7,847,637 B2 | 12/2010 | Metzger et al. |
| 7,852,150 B1 | 12/2010 | Arknaes-Pedersen |
| 7,863,841 B2 | 1/2011 | Menegoli et al. |
| RE42,093 E | 2/2011 | Hansen et al. |
| 7,884,667 B2 | 2/2011 | Nam et al. |
| 7,965,141 B2 | 6/2011 | Dooper et al. |
| 8,018,279 B2 | 9/2011 | Honda |
| 8,044,714 B2 | 10/2011 | Letemplier |
| 8,068,622 B2 | 11/2011 | Melanson et al. |
| 8,253,491 B2 | 8/2012 | Mendenhall |
| 8,311,243 B2 | 11/2012 | Tucker et al. |
| 8,362,839 B2 | 1/2013 | Hajimiri et al. |
| 2005/0212592 A1 | 9/2005 | Hida et al. |
| 2005/0285682 A1 | 12/2005 | Lee et al. |
| 2006/0028272 A1 | 2/2006 | Ozawa et al. |
| 2006/0284673 A1 | 12/2006 | Peruzzi et al. |
| 2008/0003959 A1 | 1/2008 | Lee et al. |
| 2008/0165830 A1 | 7/2008 | Tai |
| 2008/0175404 A1 | 7/2008 | Bank et al. |
| 2008/0211578 A1 | 9/2008 | Morishima |
| 2008/0284508 A1 | 11/2008 | Walker et al. |

FOREIGN PATENT DOCUMENTS

| | | |
|---|---|---|
| EP | 1427101 | 6/2004 |
| EP | 1517438 | 3/2005 |
| EP | 1320927 | 9/2008 |
| EP | 2244366 | 10/2010 |
| GB | 2275384 | 8/1994 |
| TW | 1315124 | 9/2009 |
| WO | 94/11799 | 5/1994 |
| WO | 95/15612 | 6/1995 |
| WO | 98/44626 | 10/1998 |
| WO | 00/70754 | 11/2000 |
| WO | 00/79683 | 12/2000 |
| WO | 03/055059 | 7/2003 |
| WO | 2004/019485 | 3/2004 |
| WO | 2005/060672 | 11/2005 |
| WO | 2006/047821 | 5/2006 |
| WO | 2006/069325 | 6/2006 |
| WO | 2008/024666 | 2/2008 |
| WO | 2008/144134 | 11/2008 |

OTHER PUBLICATIONS

Risbo, Lars, Morch, Thomas, "Performance of an All-Digital Power Amplification System", Presentation at 104th Convention May 16-19, 1998, Amsterdam, Audio Engineering Society.

Risbo et al., "Performance of an all-digital power amplification system", presented at the 104th AES Convention, May 16-19, 2008.

* cited by examiner

AUDIO AMPLIFIER

FIELD

The described embodiments relate to amplifier circuits. More particularly, the embodiments relates to improved audio amplifier circuits.

INTRODUCTION

All sound reproduction systems employ some means for transducing information representing desired audio content into an audible sound field. Much effort has been made to improve the efficiency and to reduce the cost of such transducers. Audio amplifiers with modulated digital switching stages are known. However, these amplifiers remain inefficient under various conditions, including when they are called on to reproduce audio signals of a small magnitude.

Accordingly, it is desirable to provide a switching amplifier that operates efficiently and has a low cost.

BRIEF DESCRIPTION OF THE DRAWINGS

Several example embodiments of the present invention will now be described in detail with reference to the drawings, in which.

In the Figures, corresponding elements are, in general, identified by similar reference numerals. The Figures are not drawn to scale and various features and waveforms have been exaggerated and compressed to indicate various features of the invention.

DESCRIPTION OF EXEMPLARY EMBODIMENTS

Figure 1:
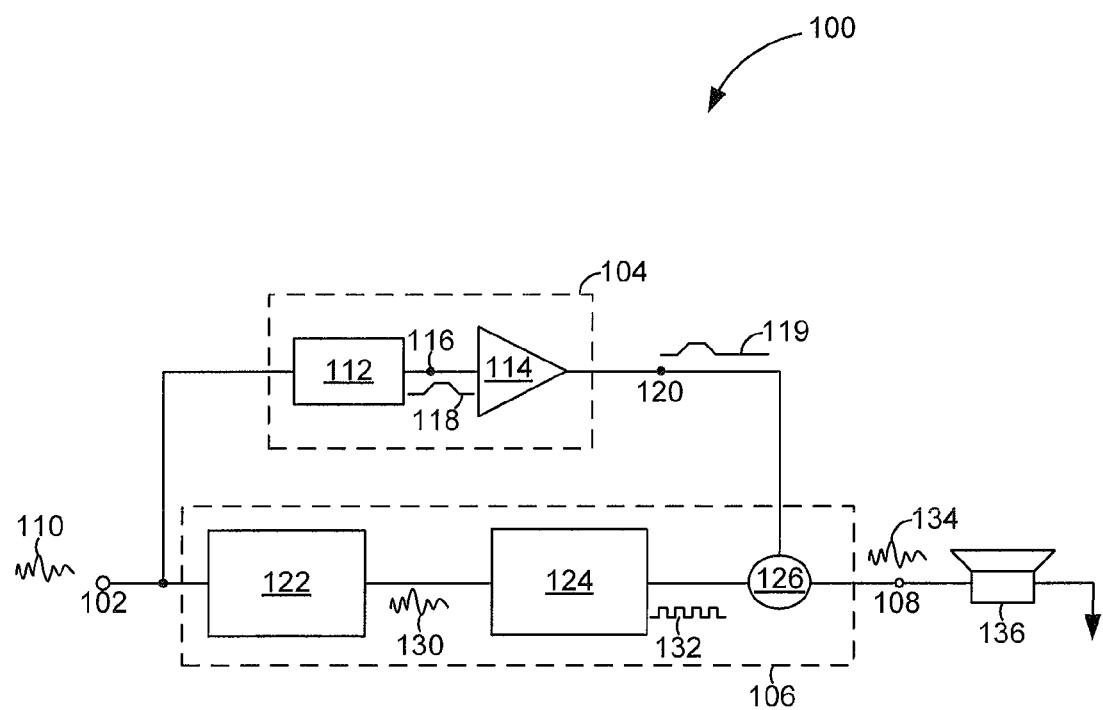
FIG. 1 illustrates an audio amplifier according to an embodiment of present invention.

Reference is first made to FIG. 1, which illustrates a first audio amplifier 100 according to some embodiments of the invention. Amplifier 100 includes an audio input terminal 102, a voltage signal generation block 104, an audio signal generation block 106 and an audio output terminal 108.

Audio input terminal 102 is typically coupled to audio source (not shown) that provides an input audio signal 110. In some embodiments, the input signal may be a one volt peak-to-peak signal with a time varying magnitude and a time-varying frequency. In other embodiments the input signal may be any other type of analog audio signal.

The voltage signal generation block 104 includes a voltage control signal generator 112 and a voltage supply 114. Voltage control signal generator 112 receives input signal 110 from the input terminal 102 and provides a voltage control signal 118 corresponding to the input signal 110 at a voltage control signal terminal 116. The voltage supply 114 receives the voltage control signal 118 and generates a voltage signal 119 at terminal 120.

The audio signal generation block 106 includes a forward compensation block 122, a modulator 124, and an output stage 126. Forward compensation block 122 receives the input signal 110 from the input terminal 102 and provides a modulation control signal 130 corresponding to the input signal 110. The modulator 124 receives the modulation control signal 130 and generates a digital modulated signal 132 corresponding to the modulation control signal 130. The output stage 126 receives both the voltage signal 119 and the modulated signal 132 and produces an output audio signal 134 at the audio output terminal 108. An audio transducer such as a speaker 136 is coupled to the audio output terminal 108 to receive the output audio signal 134.

The magnitude of any particular section of the output audio signal 134 corresponds to the magnitude of a corresponding section of the input audio signal 110. At all times, it is desirable to provide the output stage 126 with sufficient voltage headroom to allow it to generate the output audio signal 134. It is also desirable to reduce the amount of power lost in the output stage 126 due to a difference between the magnitude of the voltage signal supplied to the output stage and voltage required to generate the output audio signal 134. To reduce such power loss, the voltage supply 114 provides a voltage signal 119 at different voltage levels. The voltage signal may be generated, at any particular time, at one of a plurality of voltage levels. In some embodiments, the voltage signal may be generated at one of two voltage levels. In other embodiments, the voltage signal 119 may be generated at any one of three or more voltage levels.

Figure 2:
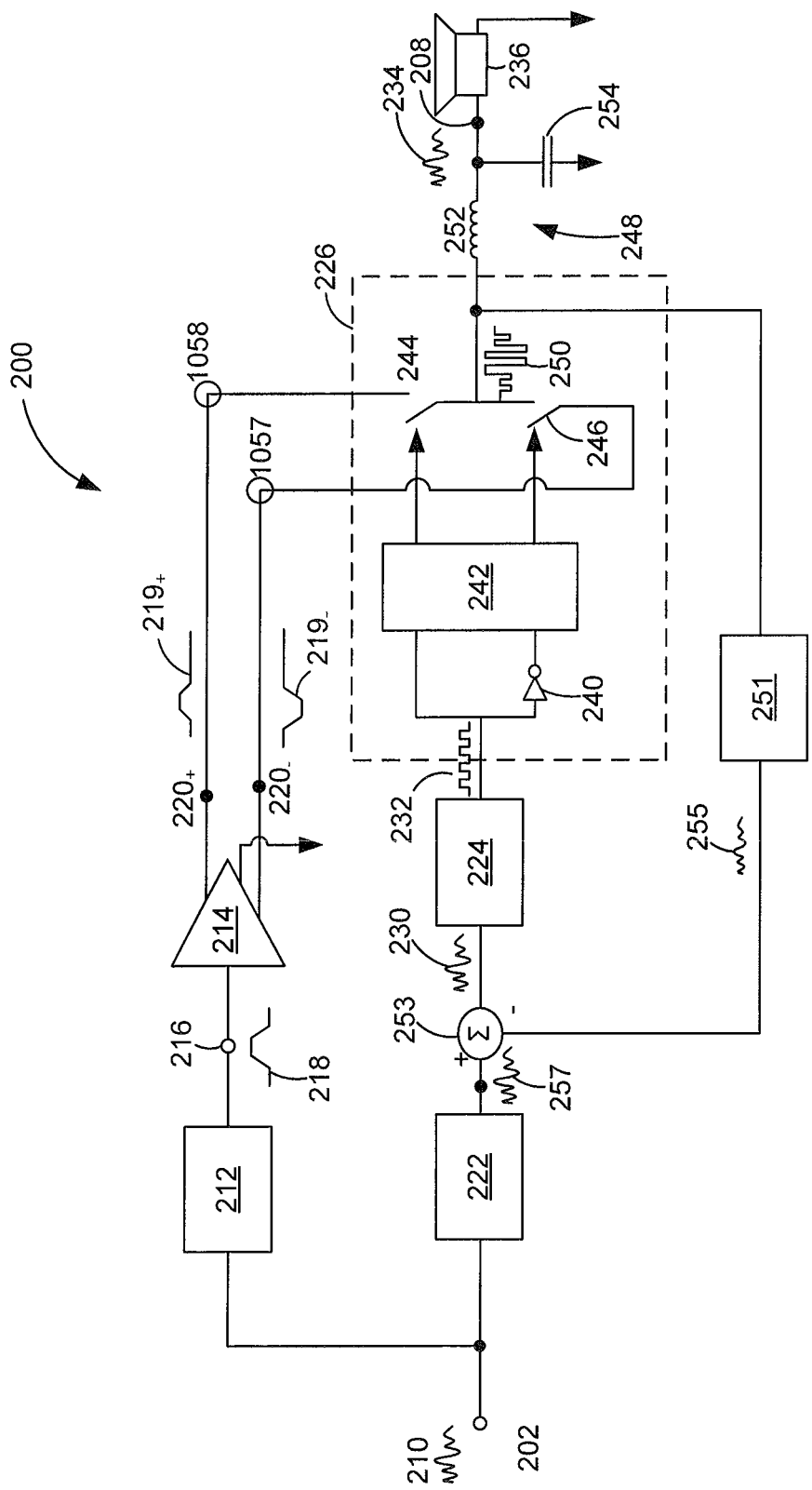
FIGS. 2-4 illustrate another audio amplifier according to an embodiment of the present invention.

Reference is next made to FIG. 2, which illustrates another audio amplifier 200 according to some embodiments of the invention. Elements of audio amplifier 200 that correspond to elements of audio amplifier 100 are identified by similar reference numerals. The output stage 226 of amplifier 200 is a push-pull output stage that includes an inverter 240, a gate drive block 242, a pair of switches 244 and 246 and an output filter 248.

Voltage supply 214 generates voltage signal 219 as a pair of power supply rails $219_+$ and $219_-$ at terminals $220_+$ and $220_-$. In this embodiment, power supply rails $219_+$ and $219_-$ are balanced about ground.

Gate drive block 242 receives a modulated signal 232 in its original form from modulator 224 and an inverted version of the modulated signal through inverter 240. Gate drive block 242 controls switch 244 in response to the original form of the modulated signal 232, coupling the positive power supply rail 219+ across speaker 236 when the modulated signal 232 is high. Gate drive block 242 controls switch 246 in response to the inverted version of modulated signal 232, coupling the negative power supply rail 219− across speaker 235 when the modulated signal is low.

The alternate coupling of the positive and negative power supply rails though switches 244 and 246 generates a modulated output signal 250. The duty cycle of the modulated output signal 250 tracks the modulated signal 232. The magnitude of the modulated output signal 250 tracks the magnitude of the power rails 219. The modulated output signal 250 is filtered through output filter 248 to produce the output audio signal 234 at audio output terminal 208. In this embodiment, output filter 248 is a smoothing filter comprising inductor 252 and capacitor 254. In other embodiments, any other type of smoothing filter may be used. In some embodiments, the output filter 248 may be omitted.

Amplifier 200 also includes a feedback compensation block 251 and a summer 253. Feedback compensation block 251 receives modulated output signal 250 and provides a feedback compensation signal 255. In amplifier 200, forward compensation block 222 provides a forward compensated input signal 257 that corresponds to the input signal 210. Summer 253 combines the forward compensated input signal with the feedback compensation signal 255 to provide a modulation control signal 230. Modulator 224 generates modulated signal 232 in response to the modulation control signal 230. The waveform and duty cycle of modulated signal 232 will depend on the nature of the modulation scheme used. For example, the modulated signal 232 may be a pulse density modulated (PDM) signal, a pulse width modulated (PWM) or other type of modulated signal. The duty cycle of the modulated signal 232 at any time will depend on the magnitude of the modulation control signal 230.

The forward compensation block 222 may be configured to compensate for various characteristics of the amplifier 200. For example, the forward compensation block 222 may delay the forward compensated input signal 257 relative to the input signal 210 to compensate for delays in the voltage control signal generator 212 and the voltage supply 214.

The feedback compensation block 251 may be configured to provide a version of the modulated output signal 250. For example, the feedback compensation signal 255 might be an analog voltage signal that is proportional to the amplified output signal 250. It may also be an analog voltage signal that is proportional to a filtered version of amplified output signal 250, in which the amplitude of the various frequency components within amplified output signal 250 have been altered to change the behavior or stability of the closed-loop system including the summing block and modulator (e.g. 251 could include a low pass filter, a PID controller, a PI controller, or another filter). In another embodiment, signal 255 may be an analog current source signal with amplitude corresponding to the amplified output signal 250 or to a filtered version of 250. In some embodiments, the feedback compensation block 251 may provide lead/lag compensation, power supply rejection or other compensation.

Figure 3:
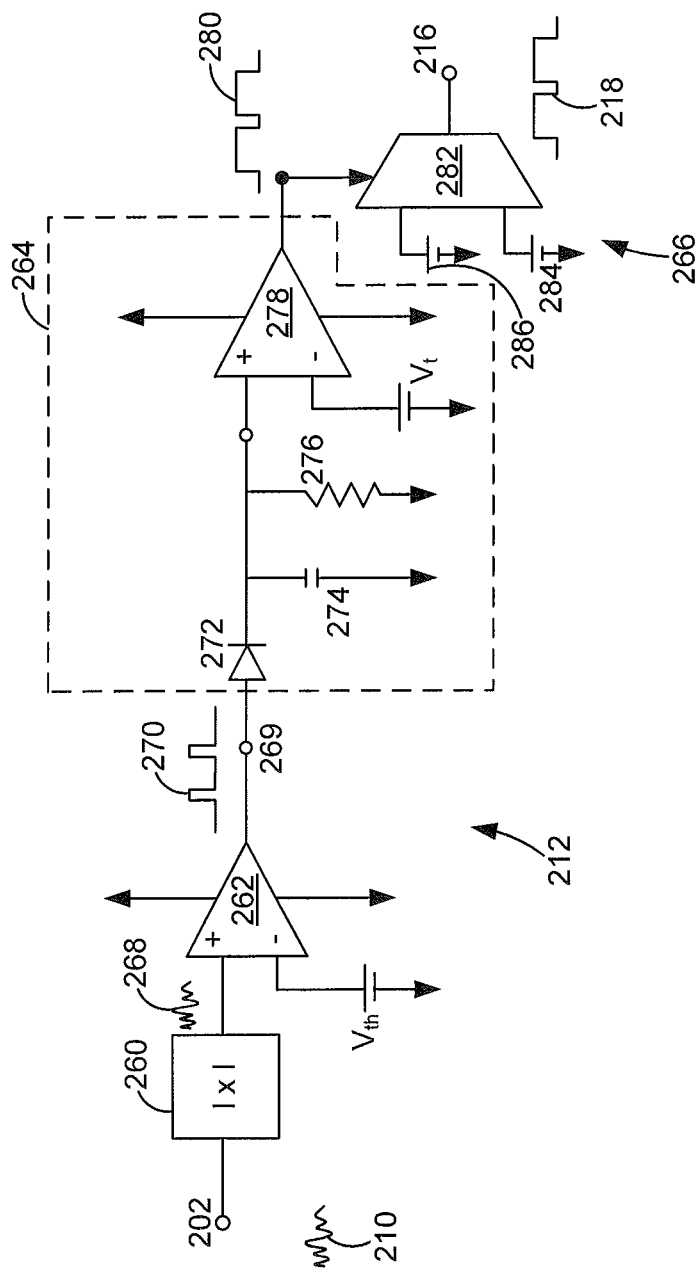

Reference is next made to FIG. 3, which illustrates a first example of a voltage control signal generator 212. Voltage control signal generator 212 includes a rectifier or absolute value block 260, a threshold comparator 262, a timing control block 264 and a voltage level selection block 266.

The operation of voltage control signal generator 212 will be explained with reference to FIGS. 5 and 6, which illustrates some of the signals generated in amplifier 200. Absolute value block 260 receives the input audio signal 210 from input terminal 202 and provides a corresponding rectified signal 268. The rectified signal is compared to a threshold voltage $V_{th}$ by threshold comparator 262. In this embodiment, the voltage signal 219 (FIG. 2) is generated, at any one time, at one of two different voltage levels $V_L$ and $V_H$. When the voltage signal is generated at the $V_H$ voltage level, the voltage signal has a higher voltage than when it is generated at the $V_L$ voltage level. In general, if the output audio signal 234 can be generated by the output stage 226 with the voltage signal 219 at the lower voltage level $V_L$, then it is preferable to generate the voltage signal at the lower voltage level $V_L$. If the magnitude of the output audio signal 234 cannot be generated (or cannot be generated with a sufficient quality level) with the voltage signal at the low voltage level $V_L$, then it is preferable to generate the voltage signal at the high voltage $V_H$.

The threshold $V_{th}$ is selected to distinguish between portions of the input audio signal 210 that can be reproduced as the output audio signal 234 with the voltage signal 219 at the low voltage level $V_L$ and those portions of the output audio signal 234 that require the voltage signal 219 to be at the high voltage level $V_H$.

Threshold comparator 262 compares the rectified signal 268 to the threshold $V_{th}$ and generates a threshold signal 270 at node 269. Threshold comparator 262 generates the threshold signal 270 at a voltage level $V_{ih}$ if the magnitude of the input audio signal 210 exceeds the magnitude of the threshold $V_{th}$ and at a voltage level $V_{il}$ a low signal if the magnitude of the input audio signal 210 is lower than the magnitude of the threshold $V_{th}$. Voltage $V_{ih}$ is higher than voltage $V_{il}$.

Figure 4:
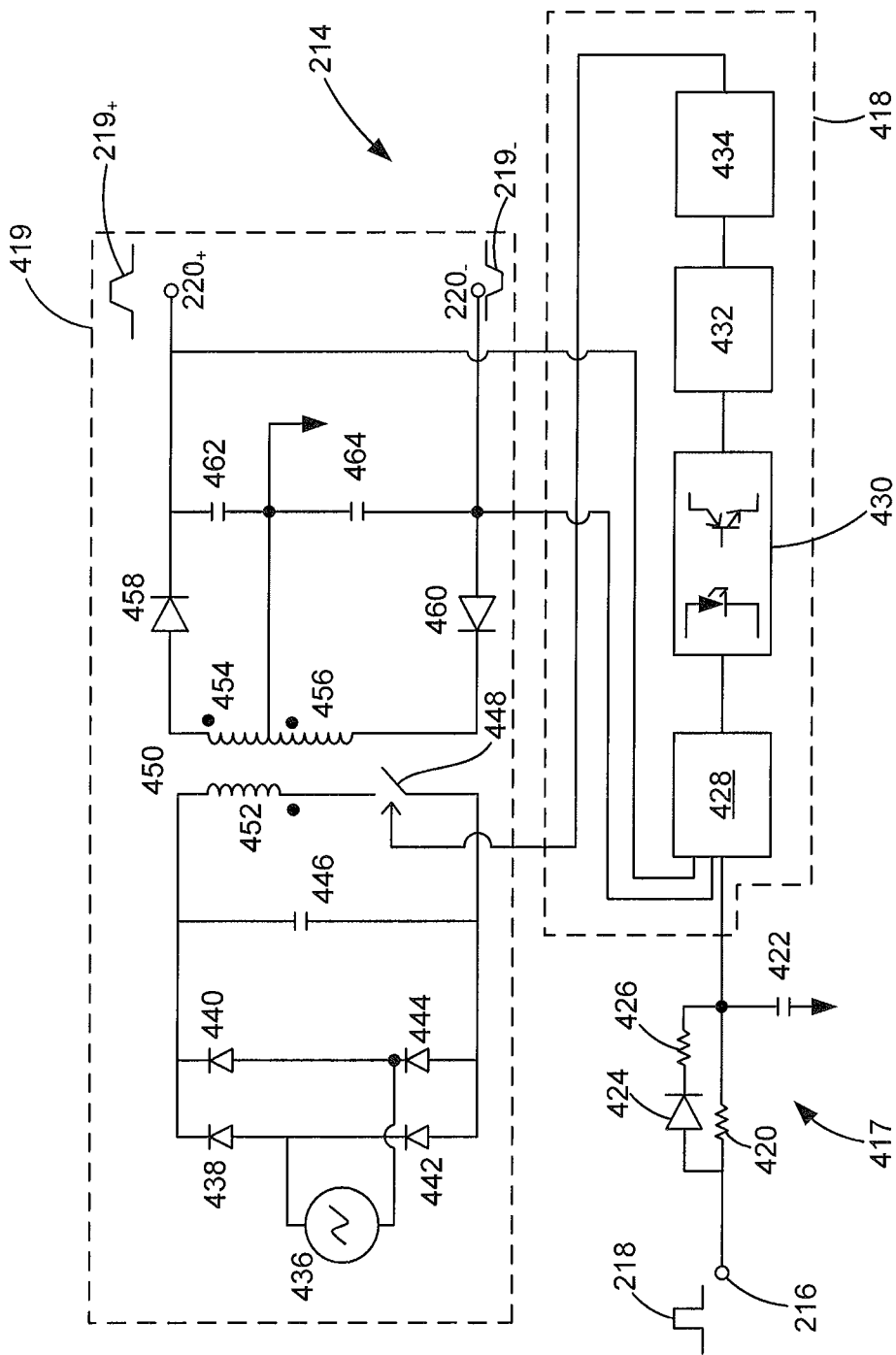

The timing control block 264 includes a diode 272, a capacitor 274 and a resistor 276 and a comparator 278. Capacitor 274 and resistor 276 are coupled in parallel between ground and node 269 through diode 272. In FIG. 4, the voltage across capacitor 274 is illustrated as $V_C$. When the threshold signal 270 is at its high voltage level $V_{ih}$, it charges capacitor 274 through diode 272 to a voltage level $V_{Ch}$, which is equal to the high voltage level $V_{ih}$ minus a diode drop. When the threshold signals switches to its low voltage level $V_{il}$, capacitor 274 discharges through resistor 276. As capacitor 274 is discharged, diode 272 is reverse biased until the voltage across capacitor 274 falls to a voltage level $V_{Cl}$, which is equal to low voltage level $V_{il}$ minus a diode drop, or ground potential, whichever is higher.

The voltage across the capacitor $V_C$ is compared to a timing voltage $V_t$ by comparator 278, which produces a voltage selection signal control 280. Timing voltage $V_t$ is selected to be between the voltage levels $V_{Ch}$ and $V_{Cl}$. When the capacitor voltage is at its maximum level $V_{Ch}$, comparator 278 generates voltage level selection control signal 280 at a high level. As the capacitor voltage decreases and becomes smaller than $V_{th}$, comparator 278 generates voltage selection control signal 280 at a low level. When the threshold signal 270 falls from its high level $V_{ih}$ to its low level $V_{il}$, the rate of the decrease in the capacitor voltage $V_C$ is controlled by the capacitance of capacitor 274 and the resistance of resistor 276. Rising edges of voltage selection control signal 280 correspond in time to rising edges in threshold signal 270. However, falling edges of voltage selection control signal 280 are delayed relative to falling edges in threshold signal 270. The length of the delay is determined by the rate of decrease in the capacitor voltage $V_C$ and the magnitude of timing voltage $V_t$. Timing control block effectively lengthens the high sections of the threshold signal 270 to form the voltage selection control signal 280.

Voltage level selection block 266 includes an analog multiplexer 282 and a pair of input voltage sources 284, 286. Reference voltage source 284 has a magnitude of $V_{cl}$. Reference voltage source 286 has a magnitude of $V_{ch}$. $V_{cl}$ is a lower voltage than $V_{ch}$. Multiplexer 282 outputs voltage control signal 218 in response to the voltage selection control signal 280. The voltage control signal 218 is equal to $V_{ch}$ if voltage selection signal 280 is high. Multiplexer 282 outputs the voltage control signal 218 equal to $V_{cl}$ if voltage selection control signal 280 is low.

Referring again to FIG. 2, voltage supply 214 receives the voltage control signal 218 and generates voltage signal 219 corresponding to the voltage control signal.

Reference is next made to FIG. 4, which illustrates an example of a voltage supply 214. Voltage supply 214 includes a voltage signal shaping circuit 417, a voltage control signal block 418 and a voltage signal generation block 419.

Voltage supply 214 has two modes of operation: a high voltage mode and a low voltage mode. Voltage supply 214 switches between its two modes of operation in response to voltage control signal 218, and under the control of the voltage signal shaping circuit 417.

The voltage control signal 218 is received by the voltage signal shaping circuit 416 at the voltage control signal terminal 216. Depending on the level of the voltage control signal 218, capacitor 422 is charged through resistors 420 and 426 to the high level $V_{ch}$ of the voltage control signal 218, or discharged through resistor 420 to the low level $V_{cl}$ of the voltage control signal 218.

When the voltage control signal 218 is at its low voltage level $V_{cl}$, the voltage supply 214 operates in its low voltage mode. Capacitor 422 is charged to $V_{cl}$.

Voltage control signal block 418 includes an error amplifier 428, an isolation block 430, a modulator 432 and a gate driver 434. The voltage across capacitor 422 is coupled to the error amplifier 428, which produces an error signal by combining the voltage across capacitor 422 with several signals from the voltage signal generation block 419. The error signal passes through isolation block 430, which provides an isolated version of the error signal. The isolation block 430 may be an opto-coupler or any other type of electrical isolation block. Isolation block 430 is an optional component and provides safety isolation between AC voltage supply 436 of the voltage signal generation block 419 and other components of audio amplifier 200.

Modulator 432 receives the isolated error signal and generates a modulated signal corresponding to the isolated error signal. Gate driver 434 produces a switching signal that also corresponds to the isolated error signal and is suitable for controlling the operation of switch 448 of the voltage signal generation block 419.

The voltage signal generation block 419 includes an AC voltage supply 436, which provides an AC voltage signal. The AC voltage signal is rectified through diodes 438, 440, 442 444 and a capacitor 446 such that a rectified and peak detected voltage corresponding to the peak voltage of the AC voltage signal appears across capacitor 446. Switch 448 operates under the control of the switching signal from gate driver 434 and alternately couples and decouples capacitor 446 to a primary winding of transformer 450. Depending on the duty cycle of the switching signal, electrical energy from capacitor 446 is injected into transformer 450 as flux energy when the switch is on, and when the switch turns off this flux energy is removed from the transformer as electrical energy to charge capacitors 462 and 464 through each of two secondary windings 454 and 456 and rectifiers 458 and 460 respectively. The voltage across capacitor 462 appears at terminal $220_+$ as voltage rail $219_+$. Similarly, the voltage across 456 is coupled to capacitor 464 and the voltage across capacitor 464 appears at terminal $220_-$ as voltage rail $219_-$. Capacitors 462 and 464 are coupled to ground, together with a center tap between the secondary windings of transformer 450, providing a ground reference for the power supply rails $219_+$ and $219_-$, which are centered about ground.

The power supply rails $219_+$ and $219_-$ are coupled to error amplifier 428. Error amplifier 428 compares a scaled-down version of whichever power supply rail has lowest magnitude to the voltage across capacitor 422. When the voltage control signal 218 is at its low voltage $V_{cl}$, capacitor 422 is also charged to $V_{cl}$ through resistor 420. Error amplifier 428 generates an error signal to maintain the power supply rails $219_+$, $219_-$ at a low power supply voltage magnitude such that the lowest magnitude power supply rail is sufficient to generate the output audio signal 234.

When the voltage control signal 218 rises to its high voltage $V_{ch}$, capacitor 422 is charged to that voltage through resistor 420 and 426. As the voltage on capacitor 422 increases, error amplifier 428 generates the error signal so that the duty cycle of the switching signal generated by gate driver 434 increases and the magnitudes of the power supply rails $219_+$, $219_-$ increases proportionally to track the increasing voltage on capacitor 422. When the voltage across capacitor reaches $V_{ch}$, the power supply rail $219_+$, $219_-$ are generated at a high power supply voltage magnitude such that the lowest magnitude power supply rail is equal to the voltage level $V_H$.

When the voltage control signal switches back to its low voltage level, capacitor 422 discharges through resistor 420. As the voltage across capacitor 422 falls, the magnitude of the power supply rails falls, until the voltage across capacitor 422 falls to $V_{cl}$ and the power rails are again generated at the low power supply magnitude equal to $V_L$.

In this example embodiment, the specific low and high power supply rail magnitudes $V_L$ and $V_H$ are proportional to the low and high voltage levels $V_{cl}$ and $V_{ch}$ of the voltage control signal 218 plus an optional offset. Transformer 450 is adapted to match the magnitude of the AC voltage supply 436 and the desired voltage levels $V_L$ and $V_H$ by selecting the turns ratios and structure of the transformer 450.

Figure 5:
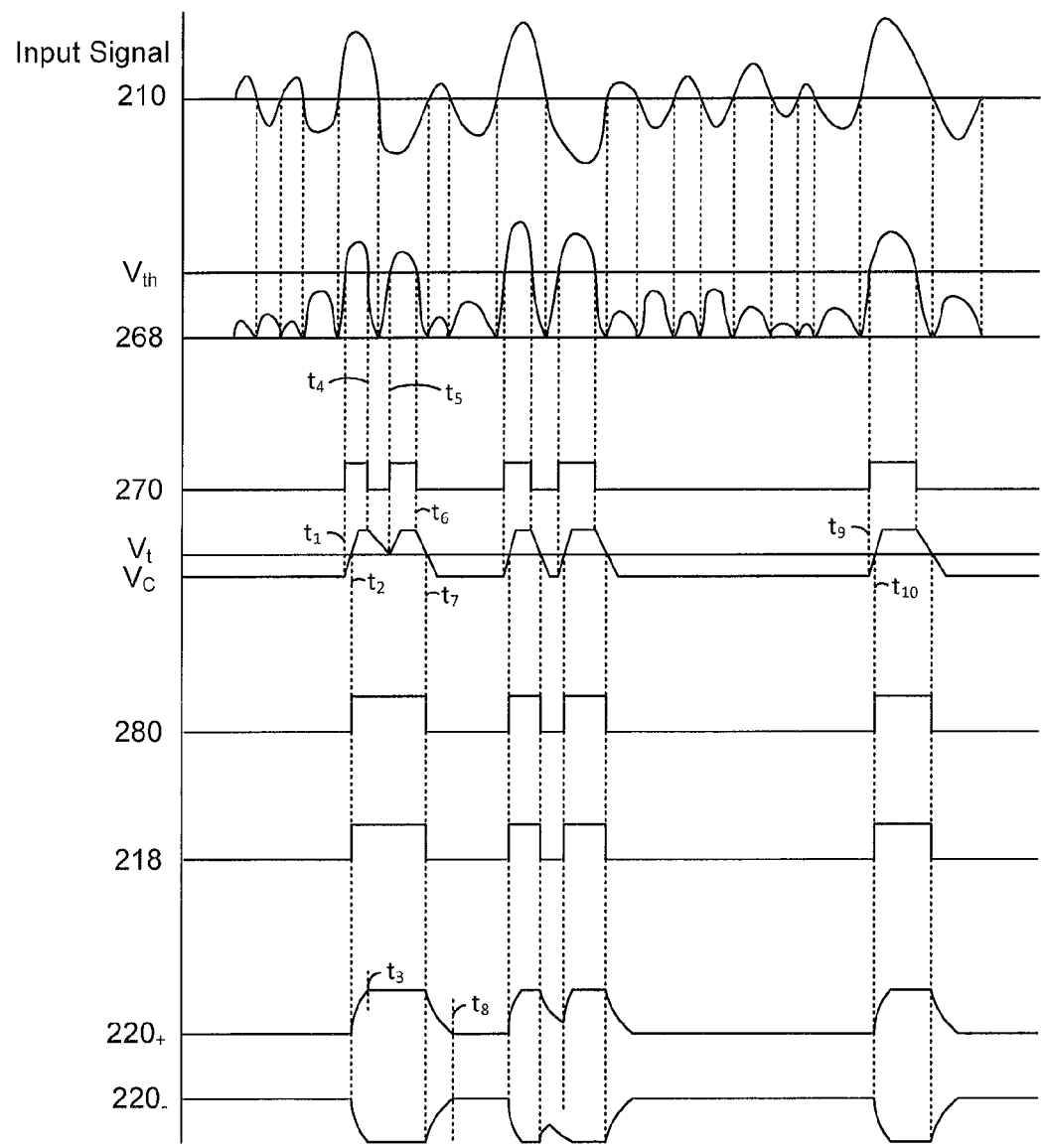
FIG. 5 illustrates various signals in the audio amplifier of FIGS. 2-4.

Referring to FIG. 5, various signals in the power amplifier 200 are illustrated on a common time scale. In FIG. 5, signal latency and stewing times are not illustrated for ease of illustration. Prior to time $t_1$, the magnitude of the rectified input signal 268 is less than the threshold voltage $V_{th}$. During this time, the threshold signal 270 is low. The voltage $V_c$ across capacitor 274 is less than the timing voltage $V_t$ and the voltage selection control signal 280 is low. Multiplexor 282 outputs a voltage control signal 218 equal to $V_{cl}$. Voltage supply 214 operates in its low voltage mode and power supply rails $220_+$ and $220_-$ are generated at their low levels.

At time $t_1$, the magnitude of the rectified input signal 268 exceeds the threshold voltage $V_{th}$. Threshold comparator 262 generates threshold signal 270 as a high signal, causing the voltage $V_c$ across capacitor 272 to rise. At time $t_2$, voltage $V_c$ exceeds the timing voltage $V_{th}$ and voltage level control signal 280 is generated at a high level. Multiplexor 282 output voltage control signal 218 equal to $V_{ch}$ and voltage supply 214 transitions to its high voltage mode. Power supply rails $220_+$ and $220_-$ transition from their low level to their high level as capacitor 422 is charged to $V_{ch}$.

Capacitor 422 charges exponentially through resistors 420 and 426. The rate of charge may be controlled by selecting the magnitude of the two parallel resistors. Preferably, capacitor 422 charges quickly enough that the power supply rails can transition to their high levels in time to produce the output audio signal with sufficient voltage headroom available to the output stage 226.

At time $t_4$ the magnitude of the input signal 210 falls below the threshold voltage $V_{th}$. Threshold signal 270 becomes low and capacitor 274 begins to discharge through resistor 276. As the voltage $V_c$ across capacitor falls, it approaches the timing voltage $V_t$. At time $t_5$, the magnitude of the input signal 210 again rises above the threshold voltage and threshold signal 270 become high. The capacitor voltage $V_c$ again rises to the high level of threshold signal 270. Between times $t_4$ and $t_5$, the capacitor voltage $V_c$ declines but does not fall below the timing voltage $V_t$.

At time $t_6$, the magnitude of the input signal 210 falls below the threshold voltage $V_{th}$ again. At time $t_7$, the voltage $V_c$ across capacitor 274 falls below the timing voltage $V_t$. Voltage supply 214 transitions to its low voltage mode. Referring to FIG. 4, between time $t_7$ and $t_8$, capacitor 422 discharges exponentially from $V_{ch}$ to $V_{cl}$ through resistor 420. The voltage across capacitors 462 and 464 also fall until the power supply rails $219_+$, $219_-$ reach their low power supply voltage magnitude.

Referring again to FIG. 5, the timing control block 264 (FIG. 3) operates to delay the voltage supply from transitioning from its high voltage mode to its low voltage from time $t_6$ to $t_7$. As a result of this delay, which depends on the magnitude of the timing voltage $V_t$ and the values of resistor 276 and capacitor 274, voltage supply 214 continues to operate in its high voltage mode for some time (equal to the time between $t_6$ and $t_7$) after the magnitude of the input signal 210 falls below the threshold voltage $V_{th}$. In some cases, the voltage supply 214 may continue to operate in its high voltage mode between two time periods in which the magnitude of the input signal 210 is higher than the threshold voltage, as is illustrated between time $t_1$ and time $t_6$, when the capacitor voltage $V_c$ does not fall below the timing voltage $V_t$.

Referring to FIGS. 2 and 5, the modulation control signal 230 is generated by summer 253 by subtracting the feedback compensation signal 255 from the forward compensated input signal 257 to provide the modulation control signal 230. Modulator 224 produces a modulated signal 232 that corresponds to the modulation control signal 230. Information about the voltage signal 219 level is contained within the modulated output signal 250 and passes through feedback compensation block 251 and into summer 253. By incorporating negative feedback of voltage signal 219 level into the modulation control signal 230 in this manner, the amplifier may reject changes in the level of power supply voltage signal 219 such that the amplifier output signal 234 remains a linearly amplified version of input signal 210.

At time $t_{10}$, the voltage on the power rails $219_+$ and $219_-$ increases in response to the magnitude of the input signal having exceeded the threshold voltage $V_t$ at time $t_9$. In amplifier 200, output stage 226 generates the modulated output signal by alternately coupling the positive power rail $219_+$ or the negative power rail $219_-$ to the speaker 236 (through filter 248) in response to the modulated signal 232. When the magnitude of the power rails changes, the duty cycle or pulse density of the modulated signal 232 may also change to compensate. At time $t_{10}$, the magnitude of the power rails begins to rise. After time $t_{10}$, the duty cycle of the modulated signal is adjusted to compensate for the higher magnitude.

In amplifier 200, the variation of the modulated signal 232 in response to changes in the power rails 219 is accomplished using feedback through feedback compensation block 251. The feedback compensation signal 255 provides an error signal indicating changes required in the modulated signal to produce a desired output signal. During transitions in the magnitude of the voltage signal, the error signal may increase, and the modulation control signal is varied to compensate for the transition.

In other embodiments, transitions in the magnitude of the voltage signal 219 may be compensated for in other ways. For example, the modulator 224 (or another component of the audio amplifier) may model the expected magnitude of the voltage signal 219 and generate the modulated signal based on the model. In other embodiments, the modulator (or another component) may receive a signal corresponding to the magnitude of the voltage signal 219 and modify the modulated output signal accordingly. In other embodiments, the forward compensation block 222 (or another component) may receive a signal corresponding to the magnitude of voltage signals $219_+$ and $219_-$ and attenuate the forward compensated input signal 257 accordingly.

In audio amplifier 100, $V_{th}$ is illustrated as a fixed voltage. In other embodiments, $V_{th}$ may be a variable level which may depend on various factors. For example, if the audio amplifier 200 has a volume control within forward compensation block 222 that affects the magnitude of the output audio signal 234, $V_{th}$ may be varied depending on the setting of the volume control. In general, if the volume control is set to produce a louder output audio signal 234, $V_{th}$ will be smaller to identify portions of the input audio signal 210 at a lower magnitude as requiring the voltage signal 219 to be generated at the high voltage level $V_H$. If the volume level is set sufficiently low, the threshold level $V_{th}$ may be increased to the point where no portion of the input audio signal 210 is identified as requiring the voltage signal 219 to be generated at the high voltage level $V_H$. In various embodiments, the volume control may be a manual or an automatic volume control.

Audio amplifier 200 receives a single input audio signal 210 and provides a corresponding amplified output audio signal 234. Other embodiments of the invention may be used to amplify more than one input audio signal.

Figure 6:
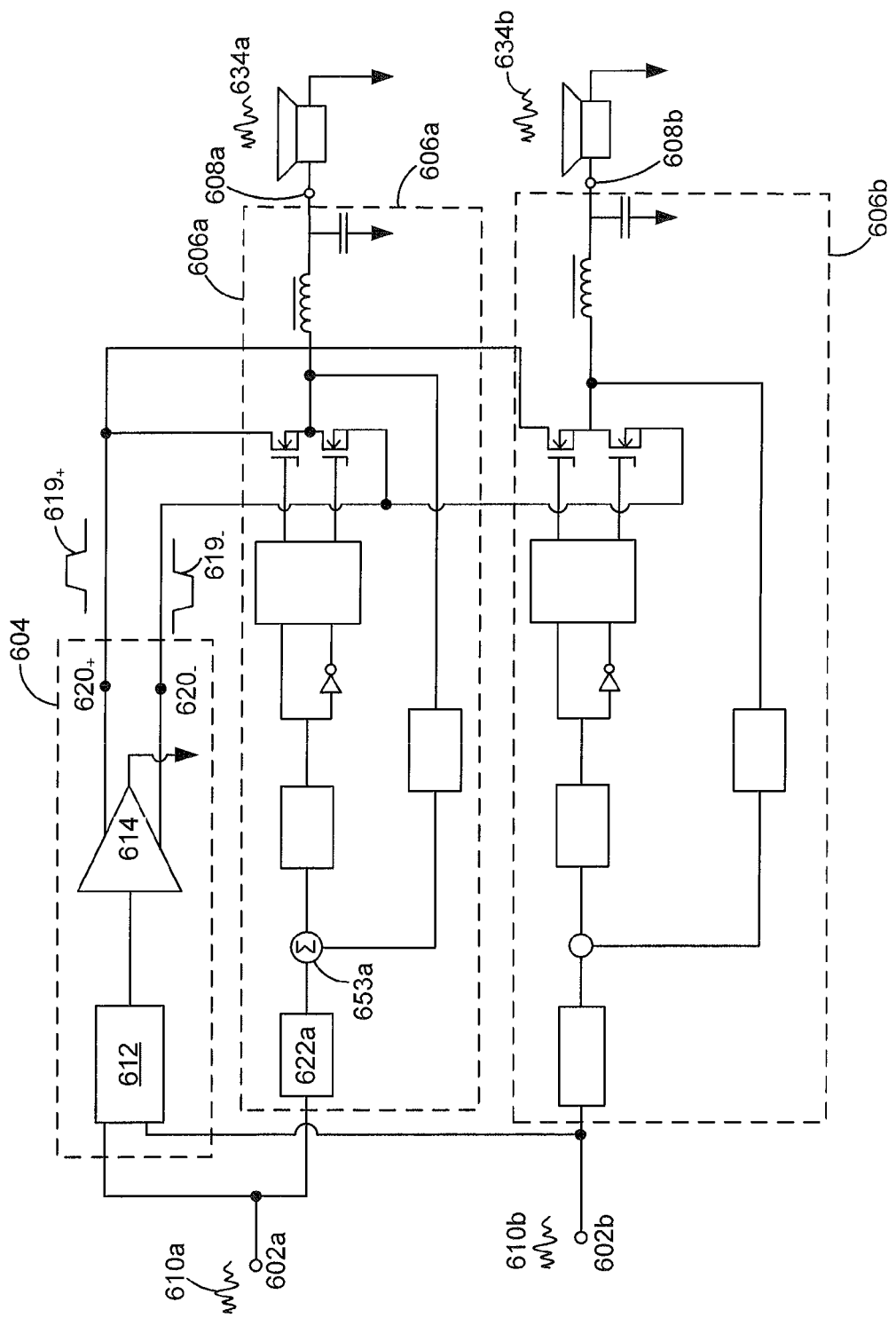
FIGS. 6 and 7 illustrate another audio amplifier according to an embodiment of the present invention.

Reference is next made to FIG. 6, which illustrates another audio amplifier 600 according to the present invention. Elements of audio amplifier 600 that correspond to audio amplifiers 100 and 200 are identified by similar reference numerals. Audio amplifier 600 has two audio input terminals 602, a voltage signal generation block 604 and two audio signal generation blocks 606, and two audio output terminals 608. Audio amplifier 600 is adapted to receive two audio input signals 610 and provide two corresponding audio output signals 634.

Audio input signal 610a is received at audio input terminal 602a. Audio input signal 610b is received at audio input terminal 602b. The inputs signals 610a, 610b are coupled to voltage control signal generator 612, which produces a voltage control signal corresponding to the input signal with the higher magnitude at any particular time.

Figure 7:
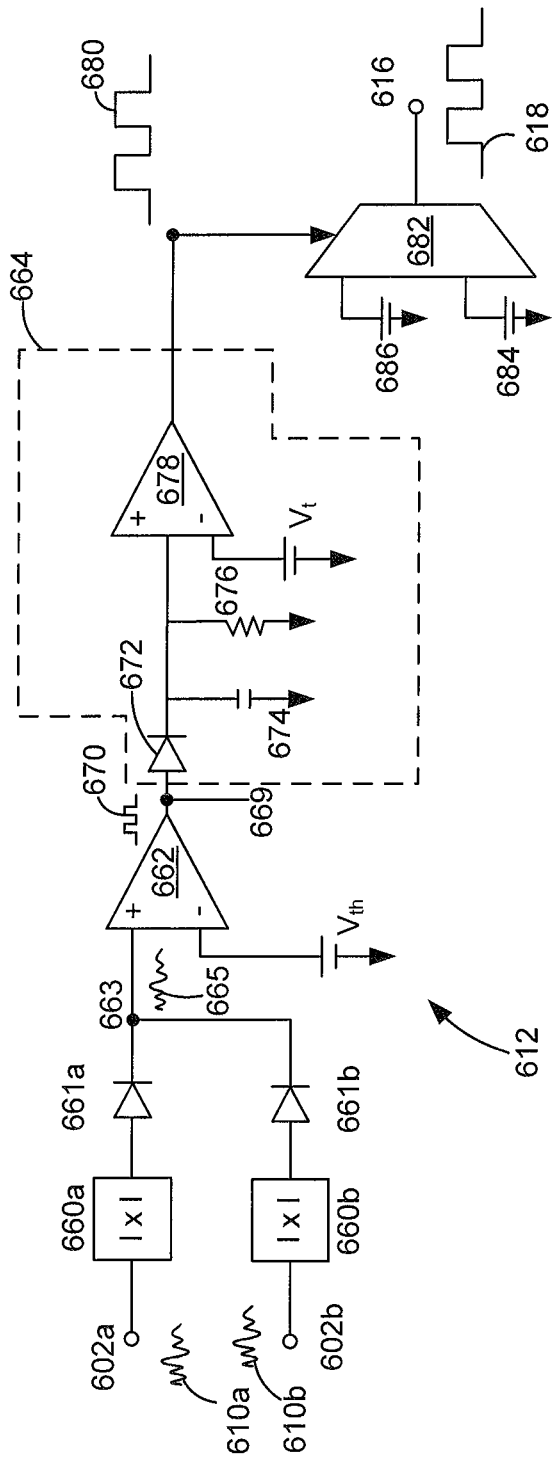

Reference is made to FIG. 7, which illustrates voltage control signal generator 612. Input signals 610a and 610b each pass through an absolute value block 660. The absolute value signals are then diode-or'd through diodes 661a and 661b and a maximum input signal 665 corresponding to the highest magnitude of the two input signals 610a or 610b appears at node 663. Threshold comparator 662 compares the maximum input signal 665 with the threshold voltage $V_t$ to generate a threshold signal 670. The remainder of voltage control signal generator 612 operates in a manner analogous to that of voltage control signal generator 212 to produce a voltage control signal 618 corresponding to the input signal with the highest magnitude at any particular time.

Voltage control signal generator 612 and voltage supply 614 generate a voltage signal 619 as a pair of power rails $619_+$ and $619_-$ corresponding to the input signal with highest magnitude at any particular time. Voltage signal generation block 604 operates in essentially the same manner as voltage signal generation block 204 of amplifier 200 (FIG. 4).

Each of the input signals 610 is coupled to a corresponding audio signal generation block 606. Each audio signal generation block 606 produces a corresponding output audio signal in a manner corresponding to that of audio signal generation block 206 of amplifier 200. The two audio signal generation blocks 606 share voltage signal generation block 604.

Audio amplifier 600 is a two channel amplifier. Typically, although not necessarily, amplifier 600 will be used to amplify two related audio signals, such as the left and right audio signals of a stereo audio signal, or two channels in a multi-channel surround sound audio signal. Typically the two signals amplified with amplifier 600 will have some general correspondence in the magnitudes of the signals over time. As a result, the voltage signal 619 will often be generated appropriately for both output audio signals. At some times, the voltage signal 619 may generated at a high level even though it would be generated at a low level if only one audio signal generation block was provided and only one of the input audio signals was being amplified. In each audio signal generation block 606, a feedback signal 655 and summer 653 provide negative feedback of the voltage signal 619 ensuring that the corresponding modulated signal 632, when combined with the voltage signal 619, produces a modulated output signal 650 corresponding to the respective input audio signal 610.

Voltage control signal generators 212 and 612 each generate a voltage control signal at one of two levels. In other embodiments, a voltage control signal generator may generate a voltage control signal at one of three of more levels.

Figure 8:
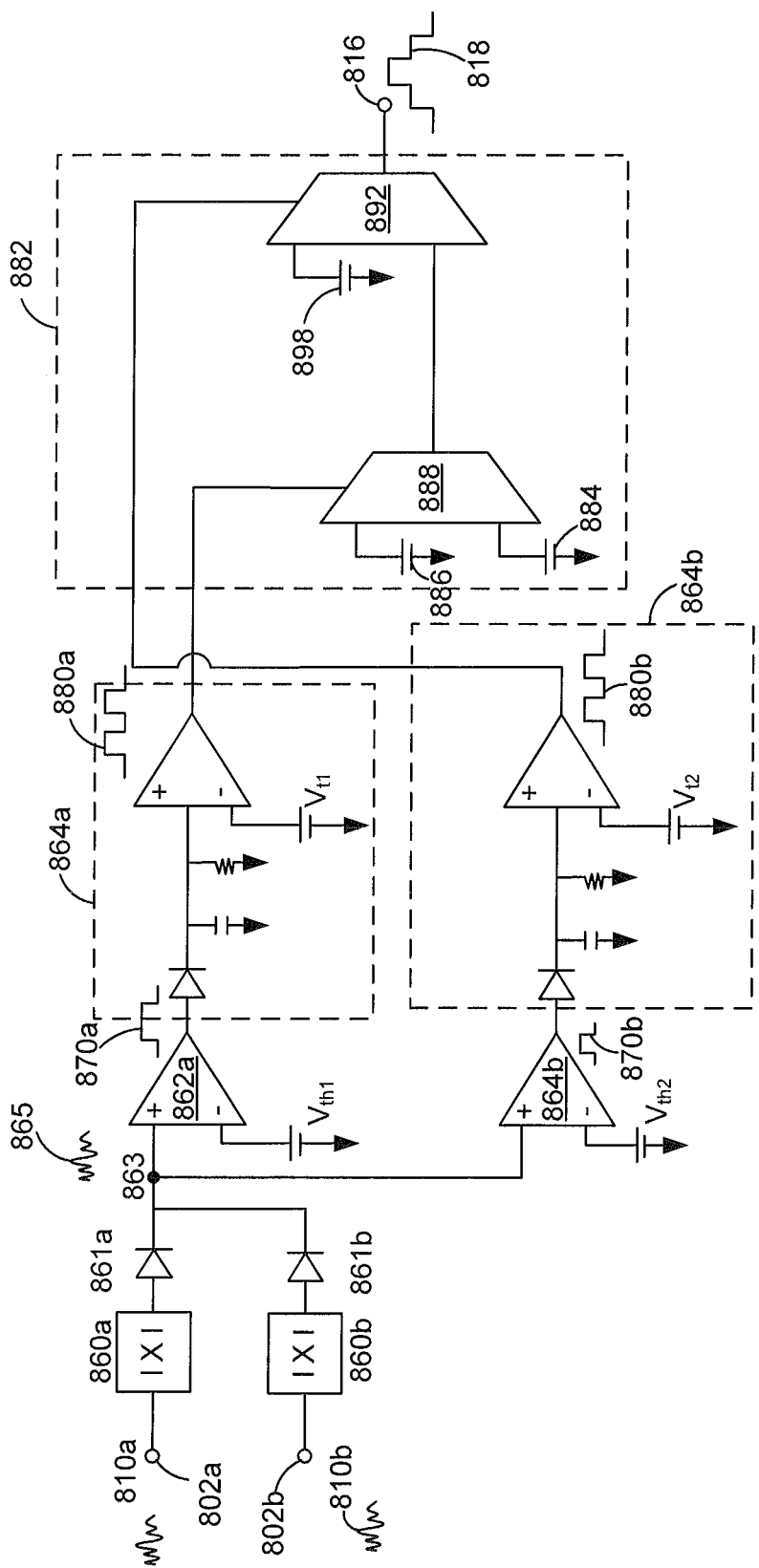
FIG. 8 illustrates a voltage signal generator according to various embodiments of the present invention.
Figure 9:
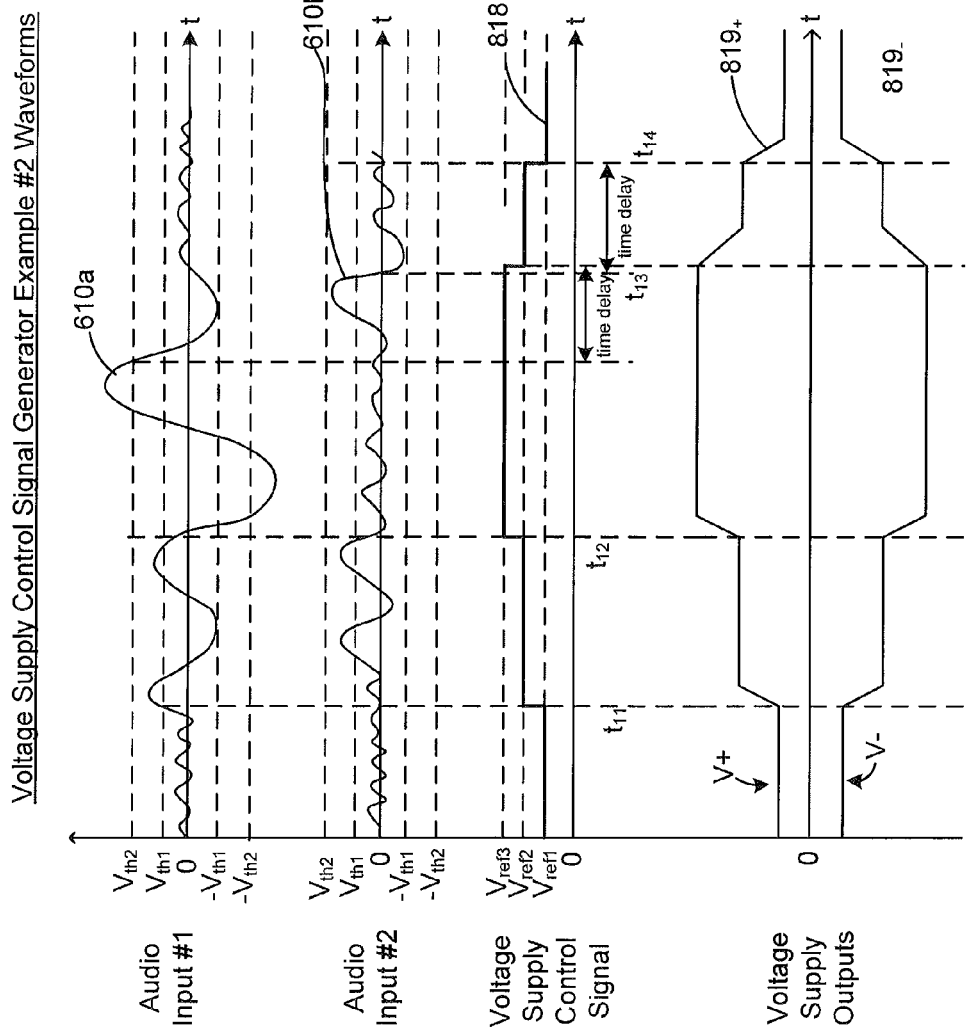
FIG. 9 illustrates various signals in the voltage signal generator of FIG. 8.

Reference is next made to FIGS. 8 and 9. FIG. 8 illustrates a voltage control signal generator 812 that generates a voltage control signal at one of three voltages. FIG. 9 illustrates some waveforms in voltage signal generator 812.

A pair of input signals 810a and 810b are received at audio input terminals 802a and 802b. The input signals 810a, 810b are rectified and compared through absolute value blocks 860 and diodes 861 to produce a maximum input signal 865. The maximum input signal is compared to a first threshold voltage $V_{ta}$ by a first threshold comparator 862a, which generates a first threshold signal 870a. The maximum input signal is also compared to a second threshold voltage $V_{tb}$ by a second threshold comparator 862b, which generates a second threshold signal. The threshold voltages are selected so that $V_{ta}$ has a smaller magnitude than $V_{tb}$. Referring to FIG. 9, the maximum input signal is smaller than $V_{ta}$ prior to time $t_{11}$. Between $t_{11}$ and time $t_{12}$, the maximum input signal is between $V_{ta}$ and $V_{tb}$ and at time $t_{12}$, the maximum input signal exceeds $V_{tb}$. At time $t_{13}$, the maximum input signal falls below $Vt_b$ and at time $t_{14}$, it falls below $V_{ta}$. Threshold signal 870a is a high signal time $t_{11}$ to time $t_{14}$. Threshold signal 870b is a high signal for a short time period between time $t_{12}$ to time $t_{13}$.

Each of the threshold signals 870 is processed by a corresponding timing control block 864, which operates in a manner analogous to timing control block 264 (FIG. 3). The timing control blocks generate a pair of voltage selection control signals 880. The sizes of the resistors 876, capacitors 878 and the timing voltages $V_{t1}$ and $V_{t2}$ may be selected to be equal or different to provide equal or different delays to lengthen the respective high sections of the two threshold signals to form the voltage selection control signals.

The voltage selection control signals 880 are used to select between three voltages in voltage level selection block 882. Voltage level selection block includes a three reference voltage sources 884, 886 and 890 and a pair of multiplexors 888 and 892. Voltage control signal 880a control multiplexor 888 to select between reference voltage source 884 or 886. Voltage control signal 880b controls multiplexor 892 to select between reference voltage source 890 and the voltage selected in multiplexor 888.

In this embodiment, the voltages of the three reference voltages are selected such that:

$V_{884} < V_{886} < V_{890}$, where $V_n$ is the voltage of voltage reference n.

A voltage control signal 818 is provided at node 816 as follows:

| Voltage selection control signal 880a | Voltage selection control signal 880b | Voltage control signal |
|---|---|---|
| Low | Low | $V_{884}$ |
| High | Low | $V_{886}$ |
| High | High | $V_{890}$ |

Voltage control signal generator 812 may be used in combination with voltage supply 214 (FIG. 4) to provide voltage signals (or power rails) 219 at one of three voltages by configuring the error amplifier 428 to generate error signals based on the three different voltage control signals levels possible for voltage control signal 818. For example, error amplifier may be designed to provide an error signal corresponding to the difference between the lowest magnitude voltage signal 219 and the voltage control signal 220, thereby automatically adjusting the voltage signals 219 when the voltage control signal changes.

Audio amplifiers 100, 200 and 600 are push-pull amplifiers, in which only two switches are required per amplifier channel but a pair of power supply rails with a split halfway between is required. The respective voltage signal generators for amplifiers 100, 200, and 600 generate a pair of power rails referenced to a potential that is located halfway between the positive voltage signal $219_+$ and the negative voltage signal $219_-$. These rails are coupled to one or more speakers under the control of a modulated signal. The present invention may also be used with a bridge amplifier.

Figure 10:
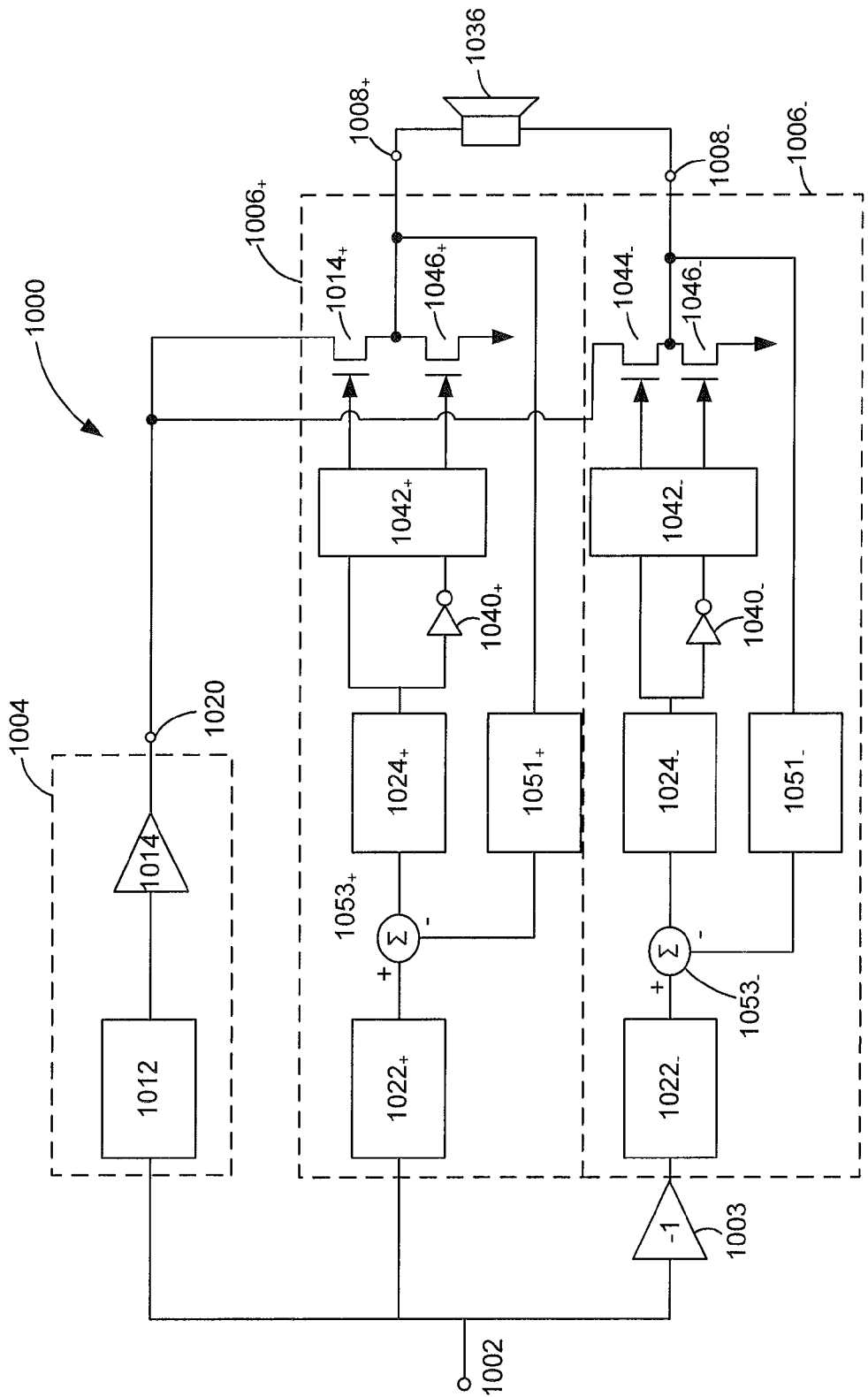
FIG. 10 illustrates another audio amplifier according to an embodiment of present invention.

Reference is next made to FIG. 10, which illustrates another audio amplifier 1000 according to the present invention. Audio amplifier 1000 is a bridge amplifier.

Audio amplifier 1000 has an audio input terminal 1002, a signal inverter 1003, a voltage signal generation block 1004 and two audio signal generation blocks $1006_+$ and $1006_-$.

Voltage signal generation block 1004 has a voltage control signal generator 1012, which is similar in structure and operation to voltage control signal generator 212 (FIG. 3), and a voltage supply 1014. Voltage supply 1014 produces a single ended voltage signal 1019 at terminal 1020.

Figure 11:
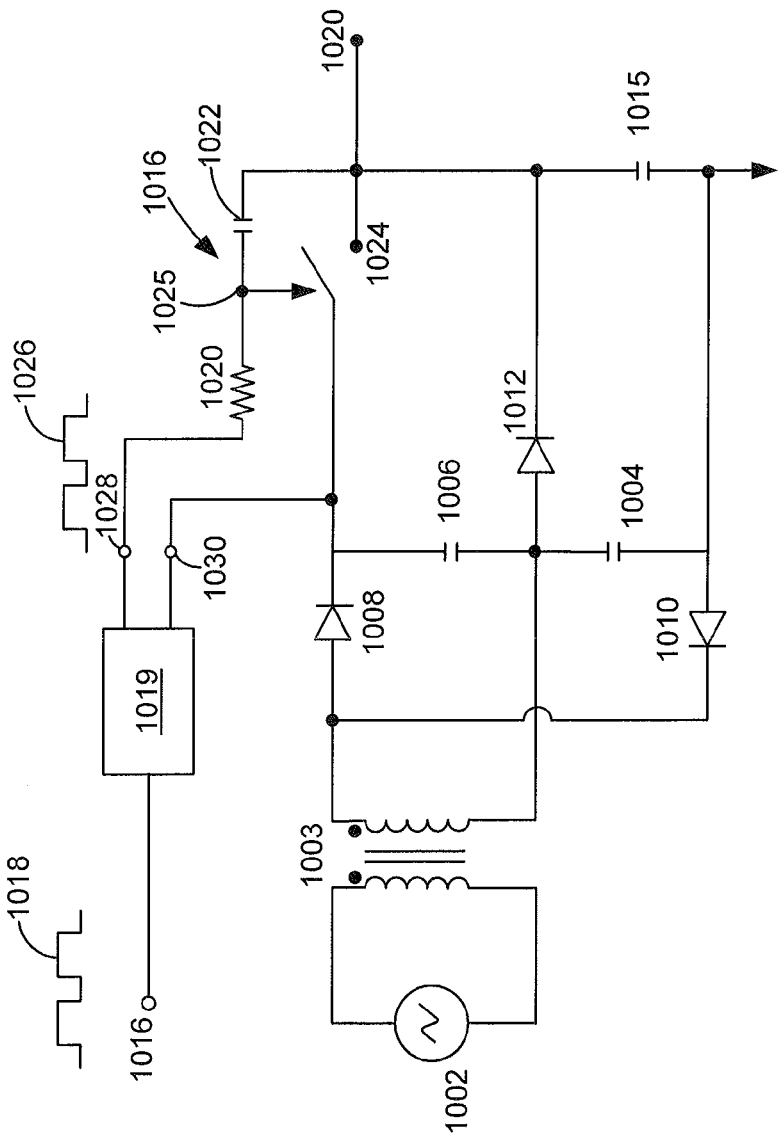
FIG. 11 illustrates a voltage supply of the embodiment of FIG. 10.

Reference is next made to FIG. 11, which illustrates voltage supply 1014. Voltage supply 1014 includes an AC voltage supply 1002, an optional transformer 1003, a low voltage capacitor 1004, a high voltage capacitor 1006, diodes 1008, 1010 and 1012, an output voltage capacitor 1015 and voltage signal shaping circuit 1016. Voltage signal shaping circuit 1016 includes a switch driver 1019, a resistor 1020, a capacitor 1022 and a switch 1024.

Voltage supply 1014 has two modes of operation: a high voltage mode and a low voltage mode. Voltage supply 1014 switches between its high and low voltage modes of operation in response to the voltage control signal 1018, and under the control of the voltage signal shaping circuit 1016. Voltage signal shaping circuit 1016 includes capacitor 1022 and resistor 1020.

Switch driver 1018 generates an output voltage control signal 1026 across nodes 1028 and 1030. Switch 1024 operates in response to the output voltage control signal 1026. Switch 1024 may be in a fully open, fully closed or partially closed condition, depending the output voltage control signal

1026. Switch 1024 may be implemented, for example, using a FET and the condition of the switch may be varied by controlling the gate-to-source voltage of the FET.

An AC voltage signal supplied from AC voltage supply 1002 is coupled through transformer 1003. Transformer 1003 is optional. In this embodiment, transformer 1003 is used to match the voltage of the AC voltage supply 1002 to the voltage required by the remainder of audio amplifier 1000, including any components coupled to the audio amplifier 1000, such as a speaker 1036. The transformer 1003 also provides safety isolation between the AC voltage supply 1002 and other components of the audio amplifier 1000.

During operation, the AC voltage signal from AC voltage supply 1002 charges low voltage capacitor 1004 and high voltage capacitor 1006. During negative half waves of the AC voltage signal, low voltage capacitor 1004 is charged through transformer 1003 and diode 1010 such that the voltage across low voltage capacitor 1004 approaches the peak magnitude of the AC voltage signal. During positive half waves of the AC voltage signal, high voltage capacitor 1006 is charged through transformer 1003 and diode 1008 such that the voltage across the high voltage capacitor 1006 also approaches the peak magnitude of the AC voltage signal.

When the voltage control signal 1018 is at its low voltage level $V_{Cl}$, the voltage supply 214 operates in its low voltage mode. Switch driver 1018 generates the output voltage control signal 1026 such that the gate-to-source voltage of transistor 1024 is zero and switch 1024 is in an off or non-conducting state. Output voltage capacitor 1015 is charged to have about the same voltage across it as low voltage capacitor 1004, through diode 1012. The voltage across output voltage capacitor 1015 is presented at terminal 1020 as the power signal 1019. The load on the voltage supply 214 includes the output stage 226. The output stage draws power from both the output voltage capacitor 1014 and the low voltage capacitor 1004.

When the voltage control signal 1018 switches from its low voltage VCl to its high voltage $V_{Ch}$, voltage supply 1014 transitions from its low voltage mode to its high voltage mode. In response to the voltage control signal 1018 being at its high voltage $V_{Ch}$, the switch driver 1018 generates the output voltage control signal 1026 which interacts with resistor 1020 and capacitor 1022 such that switch 1024 closes progressively, causing the switch 1024 to transition progressively from the off state to a partially close or partially conducting state, to an on or conducting state Assuming switch 1024 is a P-channel Metal Oxide Semiconductor Field Effect Transistor (MOSFET) switch, when the output voltage control signal falls at gate node 1028 relative to source node 1030, capacitor 1022 begins to be discharged through resistor 1020, and the voltage at the control port of transistor 1024 (at gate node 1025) falls relative to source node 1030 until it reached the MOSFET turn-on threshold voltage at the gate of the transistor relative to the source of the transistor. Once the turn-on threshold is reached, the transistor 1024 progresses to a partially-on state in which it begins to conduct a small amount of current which begins to charge capacitor 1015 through transistor 1024 and the series combination of capacitors 1004 and 1006. This charging of capacitor 1015 causes the voltage potential at drain node 1020 to rise, which causes the voltage difference between source node 1030 and drain node 1020 to begin to fall and therefore the voltage across capacitor 1022 begins to fall. This falling voltage on capacitor 1022 injects current from drain node 1020 to gate node 1025 which acts like negative feedback by keeping the gate-to-source voltage approximately equal to the MOSFET turn-on threshold voltage during the charging of capacitor 1015. This limits how much current the transistor 1024 conducts, which limits how quickly capacitor 1015 can be charged, which limits the rate of rise of the voltage signal 1019 at node 1020. The magnitude of the supply voltage 1019 rises as the voltage across the output voltage capacitor 1015 rises. Once the voltage across output capacitor 1015 has risen to be approximately equal to the sum of voltage across capacitors 1004 and 1006, the voltage at the gate node 1025 of switch 1024 fully discharges relative to the source node 1030 and the switch enters a fully-closed conducting state. When transistor 1024 is fully on, the supply voltage is approximately equal to the combined voltage across low voltage capacitor 1004 and high voltage capacitor 1006.

When the voltage control signal 1018 returns to its low voltage $V_{Cl}$, voltage supply 1014 transitions from its high voltage mode to its low voltage mode. The switch driver 1019 generates the output voltage control signal 1026 to open switch 1024 and return it to its off or non-conducting state.

When switch 1024 is opened, output capacitor 1015 discharges through its load (the audio signal generation blocks 1006₊ and 1006₋) until it reaches the voltage across low voltage capacitor 1004 minus the voltage across diode 1012. Voltage supply 1014 then continues in its low voltage mode until the voltage control signal 1018 become a high signal.

Referring again to FIG. 10, the input signal 1010 is coupled to audio signal generation block 1006₊, which has essentially the same structure and operation as audio signal generation block 206 (FIG. 2). Switches 1044₊ and 1046₊ are coupled between the voltage signal terminal 1020 and ground and audio signal generation block 1006₊ generates an output signal at terminal 1008₊ by alternately coupling terminal 1008₊ to the voltage signal 1019 or ground under the control of modulated signal 1032. Audio signal generation block 1006₋ receives input audio signal 1010 through inverter 1003, which inverts the audio signal. Audio signal generation block 1006₋ operates in essentially the same manner as audio signal generation block 1006₊ to alternately couple terminal 1008₋ to the voltage signal 1019 or ground. The audio signal generation blocks are synchronized such that, generally, when switch 1044₊ is closed, switch 1046₋ is also closed, providing a signal path for the voltage signal from voltage signal terminal 1020 through switch 1044₊, speaker 1036 and switch 1046₋ to ground. When switch 1044₋ is closed, switch 1046₊ is also closed, providing a signal path for the voltage signal from voltage signal terminal 1020 through switch 1044₋, speaker 1036 and switch 1046₊ to ground. An output audio signal 1034 is generated between terminal 1008₊ and 1008₋ by the two audio signal generation block operating together.

In audio amplifier 1000, two complete audio signal generation blocks 1006 are provided between the audio input terminal and one of the audio output terminal 1008. Each audio signal generation block 1006 has its own feedback path through a feedback block 1051, which provides a feedback signal 1055 for the respective audio signal generation block 1006. This allows differences between the audio signal generation blocks 1006, such as performance differences between components in the two audio signal generation blocks to be compensated for independently. For example, switches 1044 and 1046 may be implemented as FETs, which will typically have different performance characteristics due to manufacturing tolerances even when built to the same design. These differences can be compensated for independently in each audio signal generation block.

In another embodiment, only one audio signal generation block is used. A bridge formed of switches 1044₊, 1046₊, 1044₋ and 1046₋ is still provided. Switch 1046₋ is driven the same gate drive signal as switch $1044_+$ and switch $1046_+$ is driven by the same gate drive signal at switch $1044_-$.

Various other embodiments of voltage supply blocks may be used and several additional examples are described next.

Figure 13:
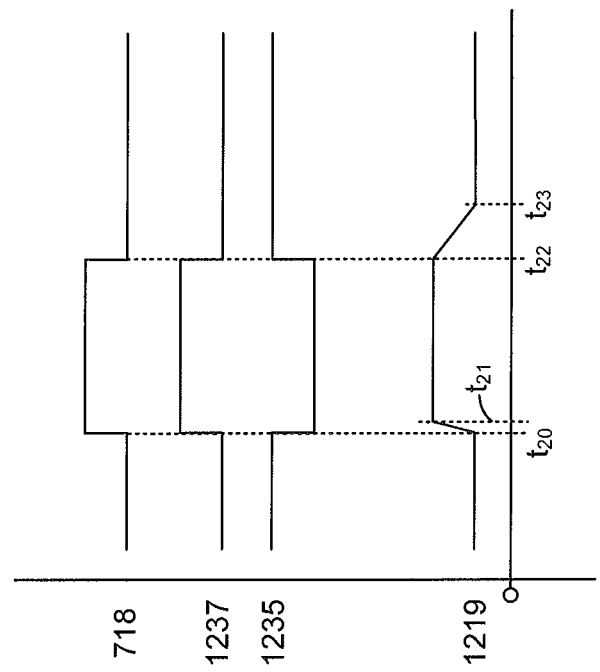
FIG. 13 illustrates signals in the voltage supply of FIG. 12.
Figure 12:
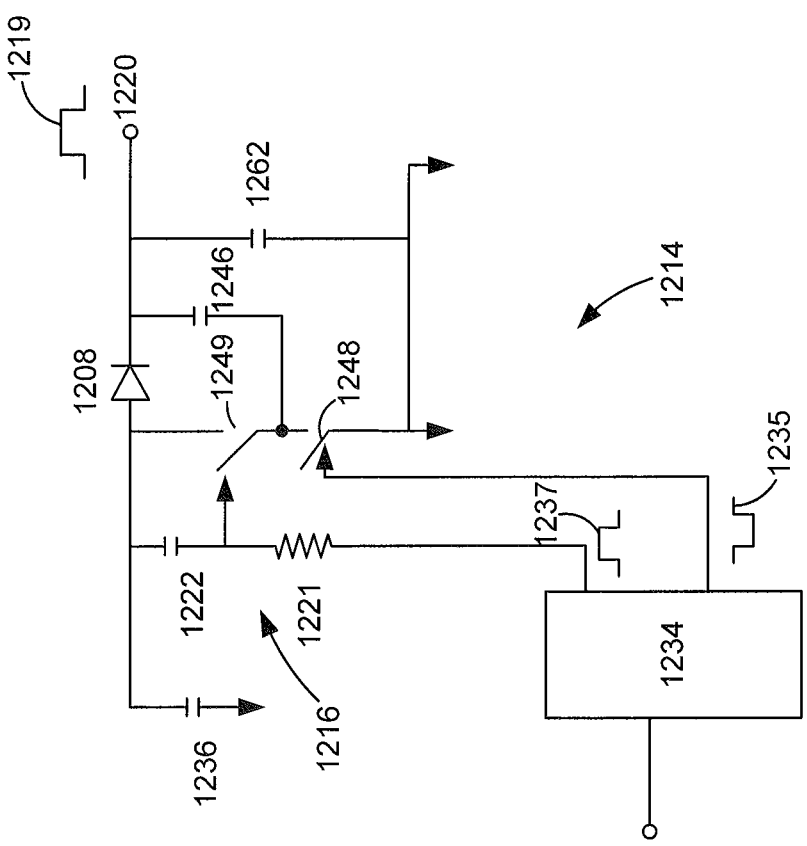
FIG. 12 illustrates another voltage supply according to various embodiments of the present invention.

Reference is made to FIGS. 12 and 13. FIG. 12 illustrates another voltage supply 1214. FIG. 13 illustrates some signals in voltage supply 1214. Voltage supply 1214 has a high voltage mode and a low voltage mode and switches between modes in response to a voltage control signal, such as voltage control signal 1018 (FIG. 10), under the control of a voltage signal shaping circuit 1216. Voltage signal shaping circuit 1216 includes capacitor 1222 and resistor 1221.

Voltage supply 1214 receives a voltage control signal 1018 at node 1016. A gate drive block 1234 generates a pair of switch control signal 1235, 1237 to control the operation of switches 1248 and 1249. A DC voltage supply 1236 provides a DC voltage signal $V_{DC}$.

In the low power mode of voltage supply 1214, the gate drive block 1234 generates switch control signals 1235, 1237 to close switch 1248 and open switch 1249. Capacitor 1246 is charged to the voltage $V_{DC}$ of the DC voltage supply 1236 minus the voltage dropped across diode 1208. Output capacitor 1262 is also charged to the same voltage $V_{DC}$ as is across capacitor 1246 and voltage signal 1219 is generated at terminal 1220 equal to $V_{DC}$ minus the voltage dropped across diode 1208 (relative to ground). Referring to FIG. 13, the low voltage mode is illustrated prior to time $t_{20}$.

When the voltage control signal 1018 becomes high, voltage supply 1214 transitions to its high voltage mode. Gate drive block generates switch control signal 1235 to open switch 1248 and generates switch control signal 1237 which interacts with capacitor 1222 and resistor 1221 to progressively close switch 1222. Switch control signal 1237 becomes high and charges capacitor 1222 through resistor 1221. As capacitor 1222 is charged, switch 1249 progressively closes and allows a limited current to charge output capacitor 1262, which causes voltage signal 1219 to rise. Switch 1249 may be implemented in various ways, including various forms of transistors. If switch 1249 is implemented as a FET, it will turn on somewhat linearly as capacitor 1222 is charged. This is illustrated between times $t_{20}$ and $t_{21}$ in FIG. 13. During this period, the voltage coupled through switch 1249 is in series with capacitor 1246, which is charged to $V_{DC}$ while in the low voltage mode. The voltage across capacitor 1246 sums together with the voltage coupled through switch 1249 to progressively increase the voltage at terminal 1220. When switch 1249 is fully closed, the full voltage $V_{DC}$ sums together with the voltage across capacitor 1246 and the voltage signal 1219 can be about two times $V_{DC}$. Capacitor 1262 is charged to this voltage, which is presented as the voltage signal 1219. Voltage supply 1214 remains in the high voltage mode as long as voltage control signal 1018 is high. During this time, the voltage across capacitor 1246 falls as it is discharged through the audio signal generation blocks $1006_+$, $1006_-$. This is illustrated between times $t_{21}$ and $t_{22}$ in FIG. 13.

When the voltage control signal 1018 returns to its low condition, gate drive block 1234 again generates switch control signals 1235, 1237 to close switch 1248 and open switch 1249. Capacitor 1246 is charged to $V_{DC}$ minus the voltage dropped across diode 1208. Capacitor 1262 discharges through the audio signal generation blocks 1006 until the voltage across it is equal to $V_{DC}$ minus the voltage dropped across diode 1208. Voltage signal 1219 declines to VDC as capacitor 1246 discharges. This is illustrated in FIG. 13 between times $t_{22}$ to $t_{23}$. The voltage supply 1214 continues in its low voltage mode until the voltage control signal 1018 becomes high.

Figure 14:
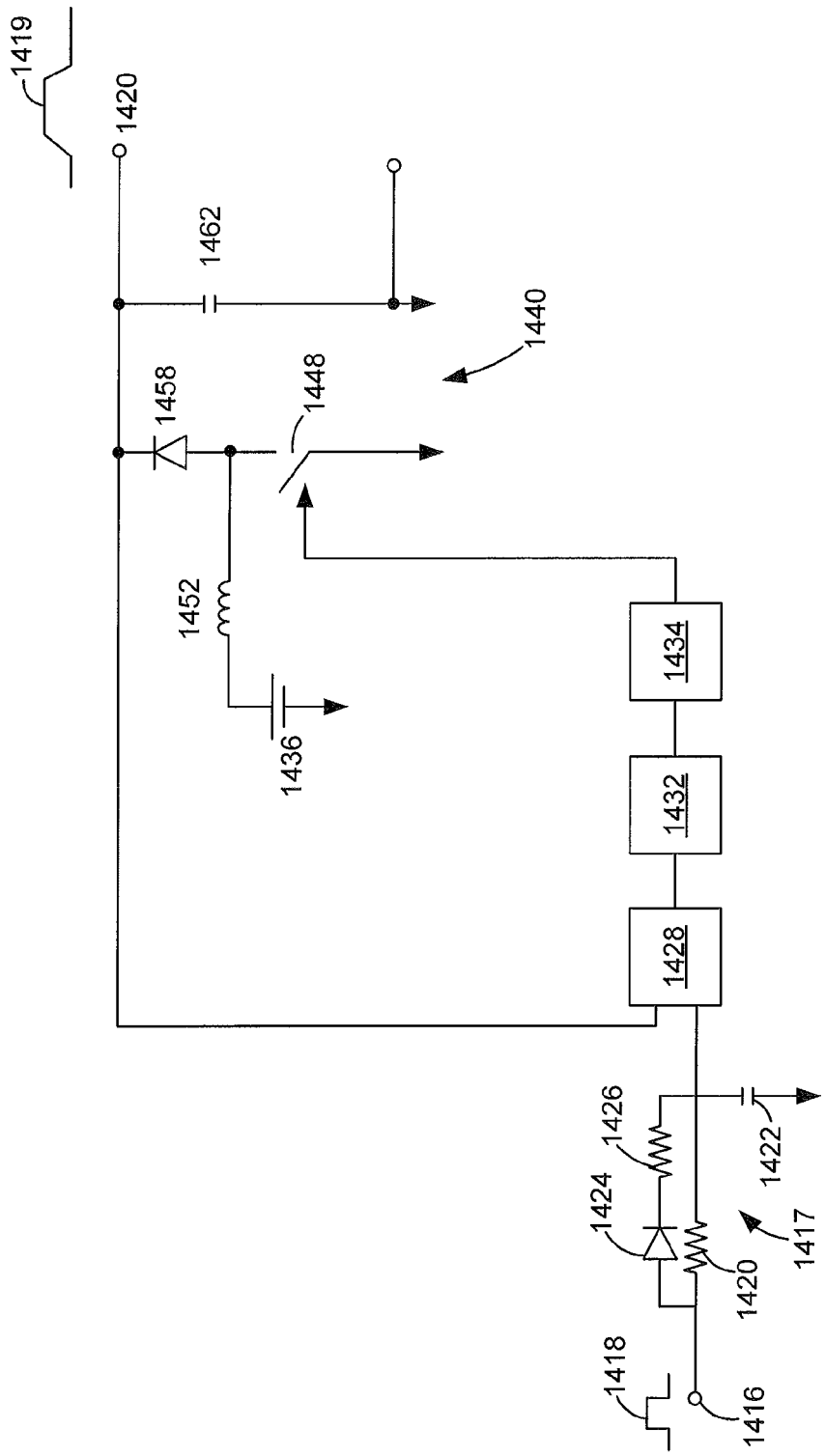
FIGS. 14 and 15 illustrate other voltage supplies according to various embodiments of the present invention.

FIG. 14 illustrates another voltage supply 1414, which operates in response to a voltage control signal 1418 and under the control of a voltage signal shaping circuit 1417.

Voltage signal shaping circuit 1416 includes resistor 1420, capacitor 1422, diode 1424 and resistor 1426. Voltage signal shaping circuit 1416 operates in the same manner as voltage signal shaping circuit 416 (FIG. 4) to charge capacitor 1422 to the voltage of voltage control signal 1418 as the voltage control signal 1418 switches between its different various voltage levels.

The operation of voltage supply 1414 will be described with reference to voltage control signal 1418 having two signal levels: a high level and a low level. Capacitor 1422 is charged to the level of the voltage control signal. An error amplifier 1428 generates an error signal indicating a difference between a desired voltage signal and the actual voltage signal 1419 in response to the level of the voltage control signal at any time.

When the voltage control signal 1418 is at its low level, the voltage supply 1414 generates voltage signal 1419 at a low level. The error signal indicates a difference between the voltage signal 1419 and the low level. A modulator 1432 generates a modulated signal and adjusts the duty cycle of the modulated signal in response to the error signal.

Power supply 1414 has a boost converter 1440 that includes a DC power supply 1436, an inductor 1452, a switch 1448, a diode 1458 and capacitor 1462. The boost converter operates in response to a modulated signal. A gate driver 1434 drives switch 1448 in response to the modulated signal from modulator 1432. When switch 1448 is closed, energy is stored in inductor 1452. When switch 1448 is open, energy stored in inductor 1452 is transferred to capacitor 1462. The voltage across capacitor 1462 is presented at terminal 1420 as the power signal 1419. The magnitude of the power signal 1419 corresponds to the duty cycle of the modulated signal.

Power supply 1414 can produce a voltage signal 1419 at two or more voltage levels in response to a voltage control signal 1418 having two or more signal levels. Typically, a voltage control signal 1418 will have two to five signal levels and power supply 1414 will produce a power signal 1419 at a corresponding number of voltage levels. In other embodiments, a power signal with more than five voltage levels may be desired and voltage supply 1414 can be used to provide such a power signal in response to an appropriate voltage control signal.

Figure 15:
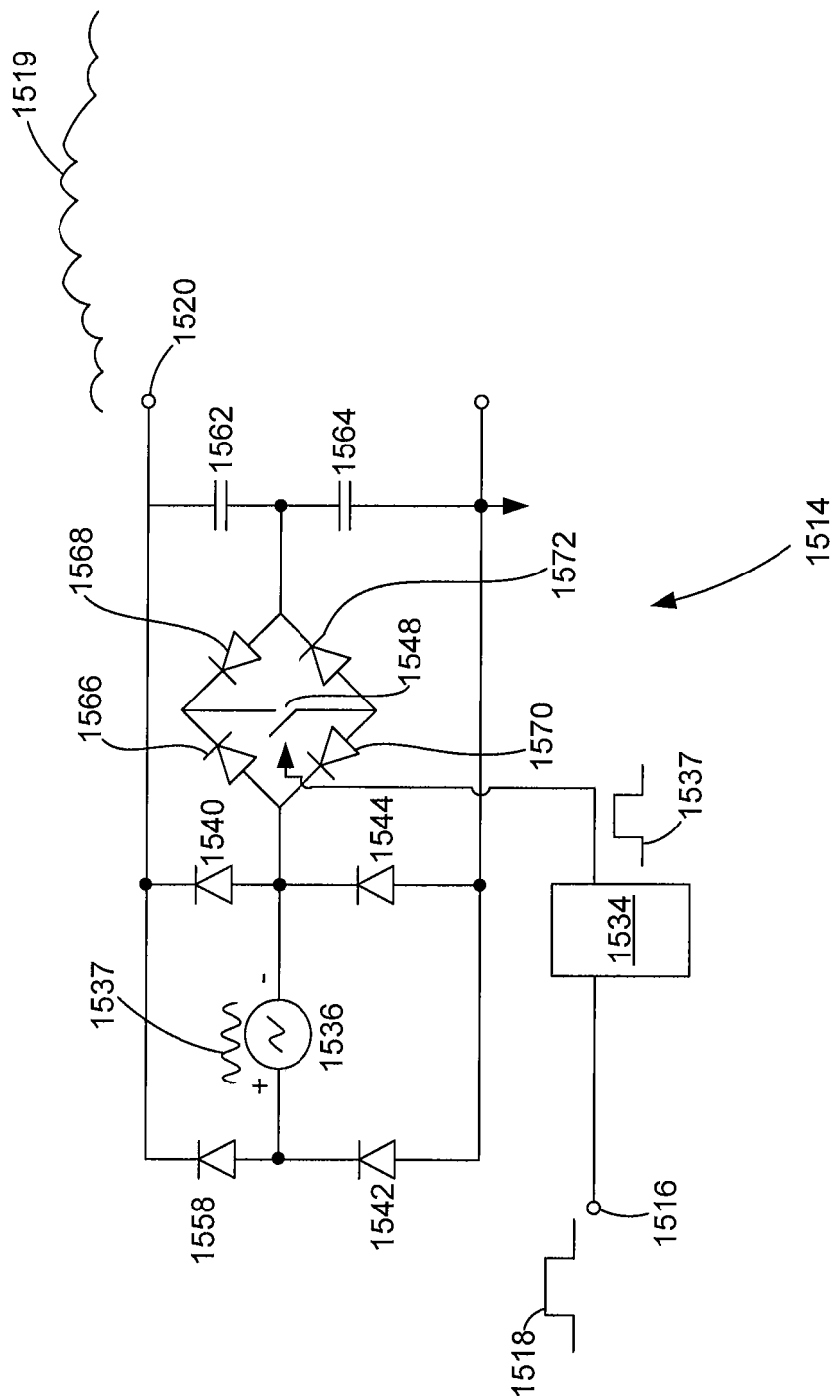
Figure 16:
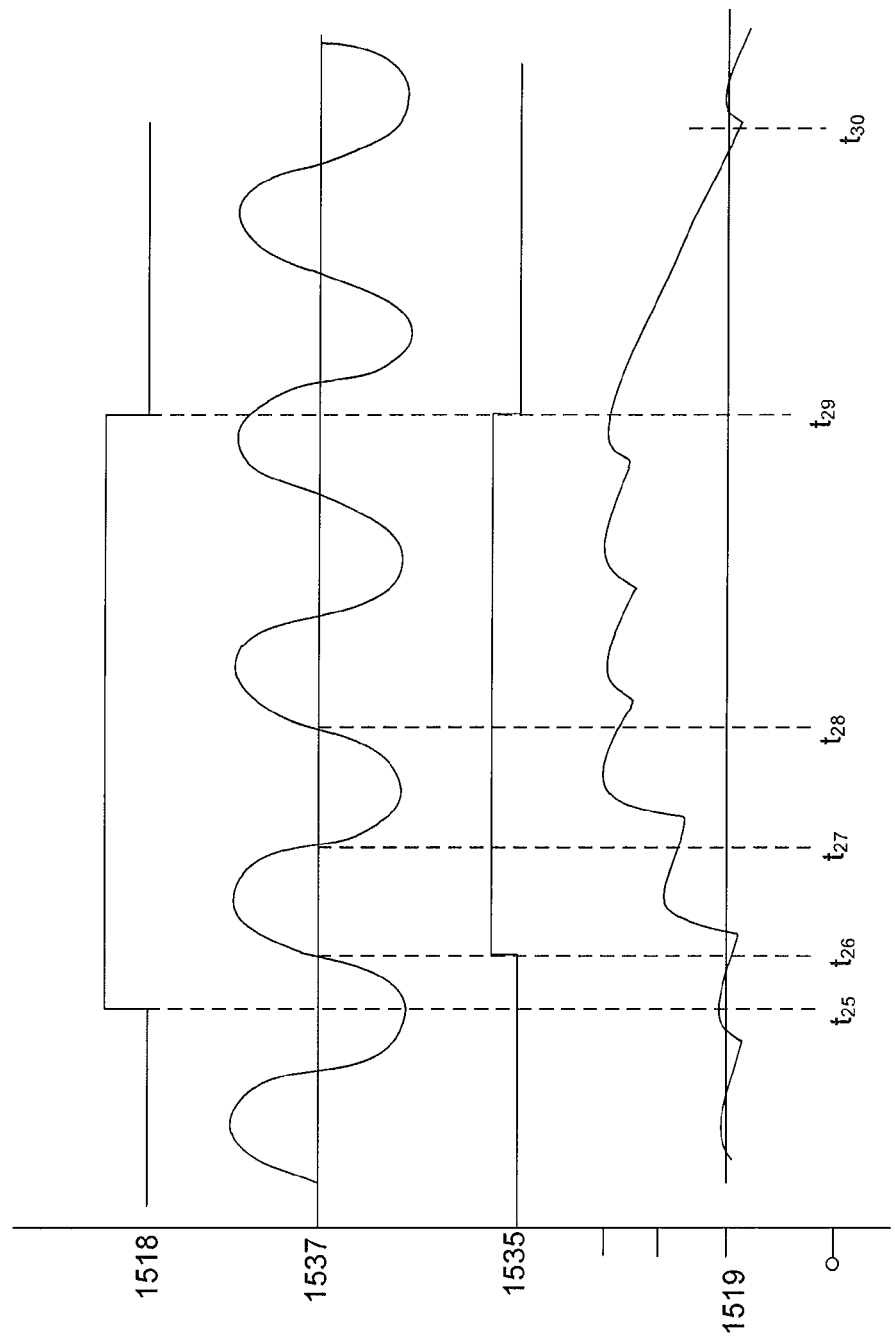
FIG. 16 illustrates signals in the voltage supply of FIG. 15.

Reference is next made to FIGS. 15 and 16. FIG. 15 illustrates another power supply 1514 and FIG. 16 illustrates some signals in power supply 1514.

Power supply 1514 receives a voltage control signal 1518 at terminal 1516. A gate driver 1534 drives a switch 1548 according to voltage control signal 1518. Voltage supply 1514 has a low voltage mode and a high voltage mode.

When the voltage control signal 1518 is low, voltage supply 1514 is in its low voltage mode. Gate driver 1534 opens switch 1548. An AC voltage supply 1536 generates an AC voltage signal 1537. AC voltage signal 1537 charges capacitors 1562 and 1564 in series. During positive half waves of the AC voltage signal 1537, capacitors 1562, 1564 are charged in series through diodes 1538 and 1544. During negative half waves of the AC voltage signal 1537, capacitors 1562, 1564 are charged in series through diodes 1540 and 1542. The sum of voltage across capacitors 1562, 1564 is equal to the peak voltage of the AC power signal 1518 such that each capacitor stores approximately 50% of the peak voltage of the AC power signal 1518. This is illustrated in FIG. 16 prior to time $t_{25}$.

When voltage control signal 1518 becomes high, voltage supply 1514 transitions to its high voltage mode. Gate driver 1534 closes switch 1548 at the next zero-crossing of the AC power signal 1535, as illustrated at time $t_{26}$. When switch 1548 is closed, each of capacitors 1562 and 1564 is charged to the peak voltage of the AC power signal. Capacitor 1562 is charged during positive half waves of the AC power signal 1535 through diodes 1538, 1568 and 1570. Capacitor 1564 is charged during negative half waves of the AC power signal 1535 through diodes 1566, 1572 and 1542. During the first half wave after switch 1548 is closed, one of capacitors 1562 or 1564 is charged to the peak voltage of AC power signal 1535, as illustrated in FIG. 16 between times $t_{26}$ to $t_{27}$. The other capacitor remains charged to about 50% of the peak voltage of the AC power signal. The combined voltage across capacitors 1562, 1564 rises to about 150% of the peak voltage of the AC power signal 1535 during this first half wave.

During the next half wave of the AC power signal, the other capacitor 1564, 1562 is also charged to the peak voltage of the AC power signal and the total voltage across the capacitors is about twice the peak voltage of the AC power signal 1535. This is illustrated in FIG. 16 between times $t_{27}$ to $t_{28}$.

When the voltage control signal 1518 becomes low, gate driver 1534 opens switch 1548. Capacitors 1562 and 1564 discharge until the voltage across them returns to about the peak voltage of AC power signal 1535. This is illustrated between times $t_{29}$ to $t_{30}$.

Figure 17:
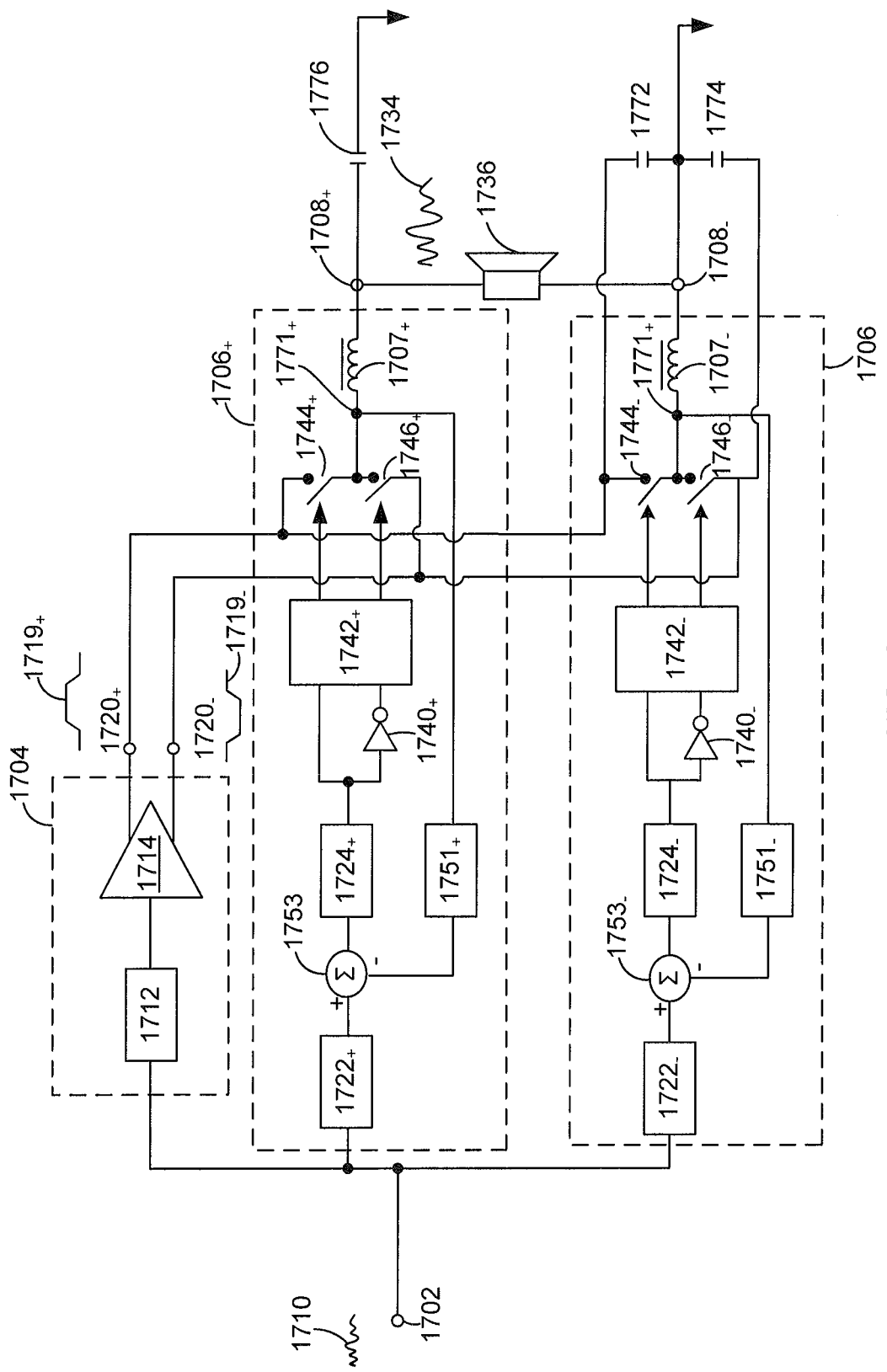
FIG. 17 illustrates another audio amplifier according to the present invention.
Figure 18:
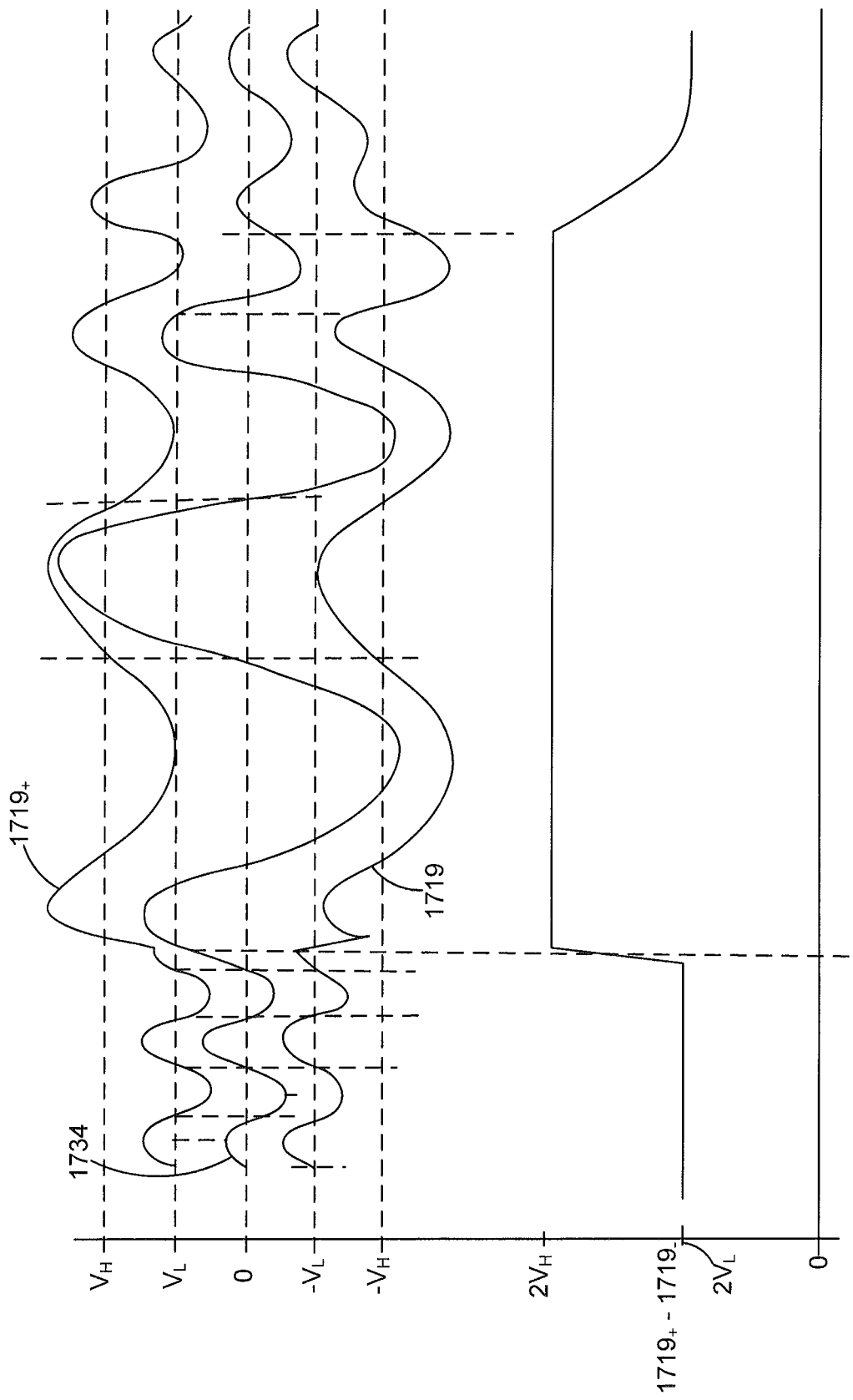
FIG. 18 illustrates some signals in the audio amplifier of FIG. 17.

Reference is next made to FIG. 17 and FIG. 18. FIG. 17 illustrates an bridge audio amplifier 1700. Amplifier 1700 has a similar construction and operation to that of amplifier 1000 (FIG. 10) and corresponding elements of the two bridge amplifiers are identified with similar reference numerals.

Bridge amplifier 1700 has a voltage supply 1714 that provides a single-ended positive power rail $1719_+$ relative to a floating negative power rail $1719_-$ with no ground connection. By designing the voltage supply with no ground connection, the power supply is simpler and the amplifier has the ability to dynamically move the power supply rails relative to ground such that a higher peak voltage can be generated across the speaker for a given voltage supply as compared to using a split-supply with push-pull amplifier configuration.

Bridge amplifier 1700 has a filtering inductor $1707_+$ coupled between terminals $1771_+$ and audio output terminal $1708_+$, and a filtering inductor $1707_-$ is also coupled between terminals $1771_-$ and audio output terminal $1708_-$. Optionally, coils $1707_+$ and $1707_-$ may wound on a common core, coupling them together. A pair of filtering capacitors 1772, 1774 couple audio output terminal $1708_-$ to the power rails $1719_+$ and $1719_-$. Terminal $1708_-$ is also coupled to ground. A filtering capacitor 1776 couples audio output terminal $1708+$ to ground.

FIG. 18 illustrates an example output audio signal 1734 and the corresponding power rails $1719_+$, $1719_-$, as well illustrating the potential between the power rails.

In amplifier 1700, power rails $1719_+$, $1719_-$ have time-varying voltages. Capacitors 1772, 1774 and 1776 allow the power rails to shift relative to ground, and effectively allow amplifier 1700 to provide an output signal 1734 with a wider dynamic range than would be possible if the power rails were fixed relative to ground.

In FIG. 18, power rails $1719_+$, $1719_-$ are initially at their low voltage level $V_L$. The power rails remain at a fixed voltage from one another, with a voltage of $2V_L$ between them. The power rails are time-varying and vary up and down in conjunction with the output signal 1734. At time $t_{40}$, the input audio signal 1710 exceeds a threshold $V_{th}$, as has been described above in relation to amplifier 200. In response, the power rails are generated at a higher voltage level $V_H$ and are separated by a voltage of $2V_H$. From time $t_{40}$ to $t_{41}$, the power rails transition from their low to their high voltage levels. The power rails vary in magnitude in time with the output signal 1734.

At time $t_{42}$, the input signal falls below threshold voltage $V_{th}$ and remains below that level. At time $t_{43}$, after a delay determined by a timing control block within the voltage control signal generator block 1712, the voltage supply 1714 again generates the power rails $1719_+$, $1719_-$ at their low voltage level $V_L$ From time $t_{43}$ to $t_{44}$, the power rails fall from their high to their lower voltage levels.

As the voltage rails swing up and down in time with the output audio signal 1734, their voltage swing effectively increases the headroom between the rails and the audio output signal, allowing the audio output signal to be generated with a wider dynamic range.

The invention claimed is:

1. An audio signal amplifier comprising:
an input terminal for receiving an input audio signal;
an output terminal;
a voltage control signal generator coupled to the input terminal, wherein the voltage control signal generator provides a voltage control signal based on the input audio signal, wherein the voltage control signal consists of one of a plurality of discrete voltage control signal levels;
a voltage regulator coupled to the voltage control signal generator, wherein the voltage regulator provides a power signal corresponding to the voltage control signal and capable of providing the power signal corresponding to any one of the plurality of discrete voltage control signal levels;
a compensation block coupled to the input terminal to provide a modulation control signal based on the input signal;
a modulator coupled to the compensation block wherein the modulator provides a digital modulated signal in response to the modulation control signal; and
an output stage coupled to the modulator and the voltage regulator, wherein the output stage provides an output audio signal at the output terminal based on the digital modulated signal and the power signal.

2. The audio amplifier of claim 1 wherein the voltage control signal generator includes a rectifier, a comparator and a voltage selection block and wherein the voltage control signal corresponds to the voltage level of the input audio signal.

3. The audio amplifier of claim 2 wherein the voltage selection block is a multiplexer with a reference voltage source and receives a threshold signal and wherein the voltage selection block provides the voltage control signal.

4. The audio amplifier of claim 3 wherein the multiplexer is a plurality of multiplexers, each multiplexer having a reference voltage source.

5. The audio amplifier of claim 2 wherein the comparator is coupled to a voltage source representing a threshold voltage, wherein the threshold voltage is selected to distinguish between portions of the input audio signal that can be reproduced as an output audio signal at a low voltage level and those portions of the input audio signal that can be reproduced as an output audio signal at a high voltage level and wherein the comparator provides a threshold signal.

6. The audio amplifier of claim 5 wherein the comparator is a plurality of threshold comparators, wherein each of the plurality of threshold comparators having a voltage source, and wherein each of the plurality of threshold comparators provides a threshold signal.

7. The audio amplifier of claim 1 wherein the voltage control signal generator includes a rectifier, a comparator, a timing control block and a voltage selection block and wherein the voltage control signal corresponds to the voltage level of the input audio signal.

8. The audio amplifier of claim 7 wherein the timing control block is a diode, a capacitor, a resistor and a comparator and wherein the timing control block provides a voltage selection control signal.

9. The audio amplifier of claim 8 wherein the capacitor and resistor are coupled in parallel between ground and a node through the diode.

10. The audio amplifier of claim 8 wherein the comparator of the timing control block includes a timing voltage reference source and wherein the timing voltage reference source is selected such that when the capacitor voltage is at its maximum level, the comparator generates a high level voltage selection control signal, and when the capacitor voltage is at a lower level, the comparator generates a low level voltage selection control signal.

11. The audio amplifier of claim 10 wherein the timing control block effectively lengthens the high sections of the threshold signal to form the voltage selection control signal.

12. The audio amplifier of claim 1 wherein the voltage regulator further including a voltage signal shaping circuit.

13. The audio amplifier of claim 12 wherein the voltage signal shaping circuit is a capacitor and a resistor and wherein the voltage regulator switches between its high and low voltage modes of operation in response to the voltage control signal and under the control of the voltage signal shaping circuit.

14. The audio amplifier of claim 13 wherein the voltage signal shaping circuit is a diode, resistors and a capacitor and wherein the voltage regulator switches between its high and low voltage modes of operation in response to the voltage control signal and under the control of the voltage signal shaping circuit.

15. The audio amplifier of claim 1 wherein the voltage regulator is operable between at least two different modes and the voltage regulator switches between each of the at least two different modes in response to at least the voltage control signal.

16. The audio amplifier of claim 15 wherein the at least two different modes comprises a high voltage mode and a low voltage mode.

17. The audio amplifier of claim 1 wherein:
the input terminal comprises a first input terminal for receiving a first input audio signal and a second input terminal for receiving a second input audio signal; and
the voltage control signal being based on one of the first input audio signal and the second input audio signal.

18. The audio amplifier of claim 17 wherein:
the voltage control signal is based on the input audio signal with a highest magnitude value.

19. The audio amplifier of claim 17 wherein:
the output terminal comprises a first output terminal and a second output terminal; and
the output stage comprises a first output stage and a second output stage, wherein each of the first output stage and the second output stage provides a respective first and second output audio signal at the corresponding first and second output terminal.

20. The audio amplifier of claim 1 wherein:
the voltage regulator provides a pair of power supply rails.

* * * * *